United States Patent
Lu et al.

(10) Patent No.: US 12,399,648 B2
(45) Date of Patent: Aug. 26, 2025

(54) DIE-BASED RANK MANAGEMENT

(71) Applicant: Micron Technology, Inc., Boise, ID (US)

(72) Inventors: Yang Lu, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 305 days.

(21) Appl. No.: 17/930,044

(22) Filed: Sep. 6, 2022

(65) Prior Publication Data

US 2024/0078041 A1  Mar. 7, 2024

(51) Int. Cl.
G06F 3/06 (2006.01)
G06F 12/02 (2006.01)

(52) U.S. Cl.
CPC .......... *G06F 3/0659* (2013.01); *G06F 3/0614* (2013.01); *G06F 3/0673* (2013.01); *G06F 12/0223* (2013.01)

(58) Field of Classification Search
CPC .... G06F 3/0659; G06F 3/0614; G06F 3/0673; G06F 12/0223; G06F 2212/1024; G06F 2212/1032; G06F 2212/7201; G06F 2212/7207; G06F 2212/7211; G06F 12/0246; G06F 2212/7208; G11C 8/12
See application file for complete search history.

(56) References Cited

U.S. PATENT DOCUMENTS

| | | | |
|---|---|---|---|
| 5,619,462 A | 4/1997 | Mcclure | |
| 5,812,861 A | 9/1998 | Ishac et al. | |
| 5,946,257 A | 8/1999 | Keeth | |
| 7,477,545 B2 | 1/2009 | Tu et al. | |
| 7,609,561 B2 | 10/2009 | Cornwell et al. | |
| 7,715,255 B2 | 5/2010 | Tu et al. | |
| 8,055,959 B2 | 11/2011 | Cornwell et al. | |
| 9,875,808 B2 | 1/2018 | Li | |
| 11,017,822 B1 | 5/2021 | Rkc Saraswatula et al. | |
| 12,300,351 B2 | 5/2025 | Lu et al. | |

(Continued)

OTHER PUBLICATIONS

"Non-Final Office Action", U.S. Appl. No. 17/823,458, Feb. 27, 2024, 6 pages.

(Continued)

*Primary Examiner* — Mohammed A Bashar
(74) *Attorney, Agent, or Firm* — Colby Nipper PLLC

(57) ABSTRACT

This document describes apparatuses and techniques for die-based rank management for a memory system. In various aspects, a die-based rank controller (controller) can determine which memory dies of a memory device are not functional to store data and correlate rank selections of a memory system to ranks of other memory dies (e.g., functional memory dies). The controller may store information that indicates the correlation or mapping of the rank selections to the ranks of the other memory dies to enable access to those ranks of the memory system. In some aspects, the controller receives a command to access the memory device with a rank selection, and the controller enables access to a corresponding rank based on the information. By so doing, aspects of die-based rank management enable memory packages with non-functional memory dies to be used instead of discarded, which can increase production utilization or lower manufacturing costs.

46 Claims, 15 Drawing Sheets

(56) References Cited

U.S. PATENT DOCUMENTS

| | | | |
|---|---|---|---|
| 2011/0302366 A1* | 12/2011 | Peterson | G06F 12/0623 |
| | | | 711/E12.001 |
| 2016/0276016 A1* | 9/2016 | Benedict | G11C 5/04 |
| 2019/0087292 A1* | 3/2019 | Kim | G11C 29/883 |
| 2021/0311638 A1 | 10/2021 | Smith | |
| 2022/0100247 A1 | 3/2022 | Garg et al. | |
| 2024/0071437 A1 | 2/2024 | Lu et al. | |

OTHER PUBLICATIONS

"Notice of Allowance", U.S. Appl. No. 17/823,458, Jan. 27, 2025, 7 pages.

"Final Office Action", U.S. Appl. No. 17/823,458, Sep. 16, 2024, 8 pages.

\* cited by examiner

DIE-BASED RANK MANAGEMENT

BACKGROUND

Memory devices, such as dynamic random-access memory (DRAM) devices, often include separate memory dies organized into ranks. In some cases, separate dies are formed on a single, semiconductor package with supporting logic and interconnected dies to provide a multiple die package (MDP). The MDP may present a bank of memory and/or may be coupled with other MDPs to form a bank of memory. In either case, if a die proves to be flawed, the rank associated with the die may be unusable and the MDP may be discarded.

BRIEF DESCRIPTION OF THE DRAWINGS

Apparatuses of and techniques for die-based rank management are described with reference to the following drawings. The same numbers are used throughout the drawings to reference like features and components:

FIG. 2-1 illustrates an example computing system that can implement one or more aspects of die-based rank management within a memory array;

FIG. 2-2 illustrates an example of a system that includes a host device and a memory device coupled together via an interconnect that can implement one or more aspects of die-based rank management;

FIGS. 3-1 through 3-3 illustrate example implementations of die-based rank management in the context of controllers that enable various DRAM operations or access;

FIGS. 4-1 through 4-6 illustrate various example implementations of die-based rank management in which a controller manages a mapping of a rank selection to a rank of memory dies in accordance with one or more aspects;

FIG. 5 illustrates an example method for enabling access to a rank of memory in accordance with one or more aspects of die-based rank management;

FIG. 6 illustrates an example method for die-based rank management in accordance with one or more aspects.

DETAILED DESCRIPTION

Overview

Figure 1:
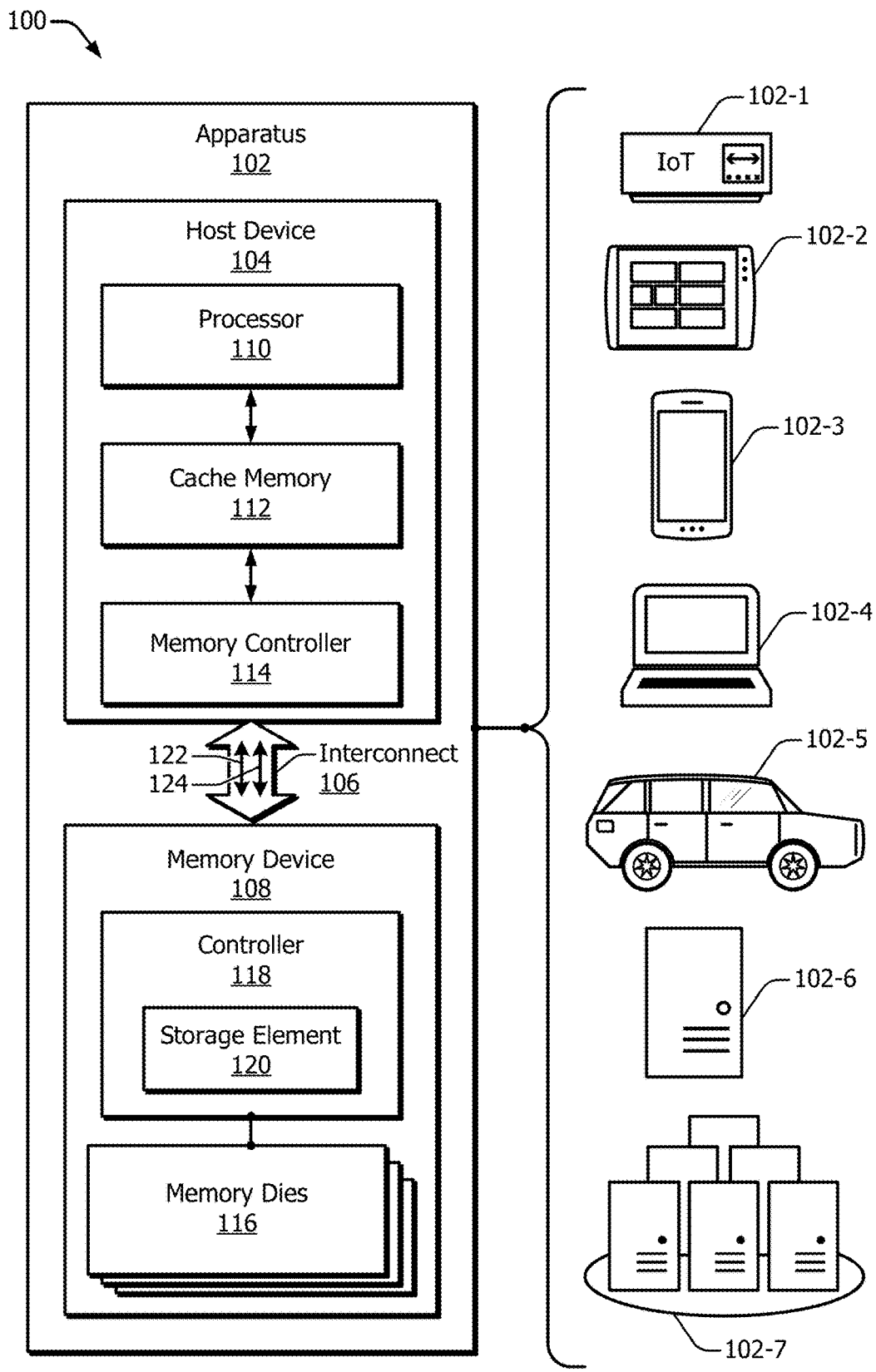
FIG. 1 illustrates an example operating environment including apparatuses that can implement die-based rank management in accordance with one or more aspects.

The increasing capabilities of electronic devices continue to require larger, higher-density memory to maintain large sets of data used in complex operations. As the storage capacity of memory devices increases, electronic devices can provide enhanced features, such as high-resolution graphics and artificial intelligence. To produce higher-density memory devices, it may be desirable to form a memory product, which includes multiple memory dies and their interconnections, on a single package. This method contrasts with producing separate memory dies that have to be separated, packaged, and mounted on a circuit board to form a memory bank. For example, Compute Express Link™ (CXL™) DRAM devices may include multiple packages, each including multiple, interconnected dies, joined together in a single module to form a compact, high-density, low-latency memory device.

Creating each of the integrated circuits may involve the formation of many numbers of minuscule transistors, capacitors, and other components, as well as the myriad interconnections therebetween, on a carefully prepared crystalline substrate. When multiple, independent devices are combined into a conventional package, if one of the devices fails testing—potentially because a single minuscule component within the die is flawed—other devices formed on the substrate may be used while only the failing device is discarded because the dies are separate from one another. Although it is undesirable to discard any dies, at least the other fabricated dies are usable.

On the other hand, in a multiple die package, if one die is defective, the utility of the package may be compromised. For example, when a package includes a memory with multiple memory dies, if one of the memory dies is faulty, the memory cannot be trusted to accurately and reliably store data for later retrieval. Thus, a package with even a single defective die may have to be discarded. If every device incorporated in a package must be perfect for the package to be useful, it reduces the pool of packages available for production of high-density memory devices, such as CXL DRAM devices. Further, the cost of having to discard die packages effectively increases the cost to produce devices that are realized using one or more multiple die packages.

As described herein, during production, subsequent testing, or subsequent use of a memory device, if a die-based rank controller (controller) determines that a memory die of the memory device is nonfunctional or unusable, the memory device as a whole may still be usable if dies other than the nonfunctional die are accessible (e.g., avoiding nonfunctional dies). For example, when the memory device receives a command with a memory address to a nonfunctional die, the controller can remap the command to a usable die to enable continued operation of the memory device. To enable these and other techniques of die-based rank management, the disclosed apparatuses and techniques provide various ways to correlate, route, translate, or map memory addresses that include a rank selection of one or more nonfunctional dies to another rank of viable or functional dies. Generally, an overall memory capacity of a memory package that implements die-based rank management may be less than that of a memory device in which all memory dies are functional or usable. With aspects of die-based rank management, however, even at a reduced capacity or capability, memory devices with memory banks remapped in accordance with one or more aspects may provide an economic or use benefit as compared to a memory package that is a total loss because of, for example, a single nonfunctional die.

In various aspects of die-based rank management, a memory device includes memory organized into multiple ranks. The memory device also includes logic comprising a die-based rank controller (controller) that is operably coupled with a storage element configured to store information. The information comprises an indication of a correlation or mapping of memory address rank selections to ranks of the multiple ranks of the memory device. The controller is configured to receive a command with the rank selection and to enable access to the rank of the multiple ranks that is correlated with the rank selection. Generally, the correlation of the rank selection may be different from a direct correlation to a respective rank of the memory device (e.g., indirect or nonsequential), such that the described aspects enable redirection of a typical or default rank selection to physical rank mapping that includes a nonfunctional die to another rank of the memory device of functional dies. In other words, the described aspects can map or remap a rank selection from a nonfunctional rank to a functional rank to provide an operable memory device. Alternatively or additionally, the rank that includes the nonfunctional die may be omitted or removed from the information of the storage element, such that selection of that inoperable rank is prevented. In some cases, the controller may also disable the rank that includes a nonfunctional die, such as by deasserting or holding a chip-select line low state.

In other aspects, the die-based rank controller may determine when one or more memory dies of a rank associated with a rank selectable through a memory address are not functional to store data and correlate or map the rank selection with another rank of functional memory dies. The correlation of the rank with the other rank of functional memory dies can then be stored to enable access to the other rank in response to commands directed to the rank selection previously associated with the rank including the nonfunctional memory die. These are but a few examples of die-based rank management for memory devices, others of which are described throughout this disclosure.

Example Operating Environments

Described apparatuses and techniques relate to aspects of implementing die-based rank management, which may redirect access of a memory address that specifies a rank including a nonfunctional memory die to another rank of functional memory dies. In aspects, a die controller or manager is associated with a storage element configured to maintain information that correlates or maps rank selections available through memory addressing from a rank with a nonfunctional die to another rank of functional dies. As a result, when a host or other device issues an instruction or command or otherwise initiates a memory operation that would be directed to read data from or write data to a rank including the nonfunctional die, the controller redirects that operation to a rank that includes functional dies. Accordingly, in some aspects, a memory device that includes nonfunctional or unusable dies may still be used (at least in partial capacity) by redirecting operations from unusable ranks or portions of the memory device (or package) to functional or operational portions (e.g., viable ranks of memory dies) thereof.

FIG. 1 illustrates at 100 an example operating environment including an apparatus 102 that can implement a die-based rank management. The apparatus 102 can include various types of electronic devices, including an internet-of-things (IoT) device 102-1, a tablet device 102-2, a smartphone 102-3, a notebook computer 102-4, a passenger vehicle 102-5, a server computer 102-6, and a server cluster 102-7 that may be part of cloud computing infrastructure or a data center or portion thereof (e.g., a printed circuit board (PCB) or blade server). Other examples of the apparatus 102 include a wearable device (e.g., a smartwatch or intelligent glasses), an entertainment device (e.g., a set-top box, a video dongle, a smart television, a gaming device, etc.), a desktop computer, a motherboard, a server blade, a consumer appliance, a vehicle, a drone, industrial equipment, a security device, a sensor, or the electronic components thereof. Each type of apparatus can include one or more components to provide computing functionalities or features.

In example implementations shown at 100, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, multiple instances of a memory die 116, which may be included as part of a package. In this example, the memory device also includes a die-based rank controller 118 (controller 118) and a storage element 120 that is configured to store information for enabling various aspects of die-based rank management. The at least one memory die 116 may include dynamic-random access memory (DRAM) dies or other volatile or nonvolatile memory dies. For example, when the one or more memory dies 116 include DRAM dies, the memory device 108 may include a three-dimensional (3D) stacked DRAM device, which may be a high-bandwidth memory (HBM) device or a hybrid memory cube (HMC) device. The memory device 108 can operate as a main memory for the apparatus 102. The memory device 108 may also or instead include storage memory. In such cases, the memory device 108 may include a flash memory, a solid-state drive, a phase-change memory (PCM), a 3D XPoint™ memory, or another type of storage memory.

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, a central processing unit (CPU), a graphics processing unit (GPU), a neural network engine or accelerator, an application-specific integrated circuit (ASIC), a field-programmable gate array (FPGA) integrated circuit (IC), or a communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to memory with appropriate formatting, timing, and reordering. The memory controller 114 can also forward to the processor 110 responses to the memory requests received from memory.

The host device 104 is operatively coupled to the memory device 108 via the interconnect 106. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus, switching fabric, or one or more wires that carry voltage or current signals.

In some implementations, the interconnect 106 can include at least one command and address bus 122 (CA bus 122) and at least one data bus 124 (DQ bus 124). Each bus may be a unidirectional or a bidirectional bus. The CA bus 122 and the DQ bus 124 may couple to CA and DQ pins, respectively, of the memory device 108. The interconnect 106 may also include at least one chip-select (CS) input/output (I/O) or line (not illustrated in FIG. 1) that can, for example, couple to one or more CS pins of the memory device 108. The interconnect 106 may further include at least one clock bus (CK bus, not illustrated in FIG. 1) that is part of or separate from the CA bus 122.

In other implementations, the interconnect 106 can be realized as a CXL link. Thus, the interconnect 106 can comport with at least one CXL standard or protocol. The CXL link can provide an interface on top of the physical layer and electrical signaling of, for example, a Peripheral Component Interconnect Express (PCIe) 5.0 physical layer. The CXL link can cause requests to and responses from the memory device 108 to be packaged as flits. In still other implementations, the interconnect 106 can be another type of link, including a PCIe 5.0 link. In this document, some terminology may draw from one or more of these standards or versions thereof, such as the CXL standard, for clarity. The described principles, however, are also applicable to memories and systems that comport with other standards and types of interconnects.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. System designers can also include any of the illustrated components in distributed or shared memory systems.

System designers may implement the host device 104 and the various memories in multiple manners. In some cases, the host device 104 and the memory device 108 can be disposed on, or physically supported by, a PCB (e.g., a rigid or flexible motherboard). The host device 104 and the memory device 108 may additionally be integrated together on an IC or fabricated on separate ICs and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 2 an example computing system architecture having at least one host device 104 coupled to a memory device 108.

Two or more memory components (e.g., modules, dies, banks, or bank groups) can share the electrical paths or couplings of the interconnect 106. In some implementations, the CA bus 122 transmits addresses and commands from the memory controller 114 of the host device 104 to the memory device 108, from which the CA bus 122 may exclude propagation of data. The DQ bus 124 can propagate data between the memory controller 114 and the memory device 108. The memory device 108 may also be implemented as any suitable memory, including but not limited to DRAM, SDRAM, 3D stacked DRAM, DDR memory, or low-power DDR (LPDDR) memory (e.g., LPDDR DRAM or LPDDR SDRAM).

The memory device 108 can form at least part of the main memory of the apparatus 102. The memory device 108 may, however, form at least part of a cache memory, a storage memory, or an SoC of the apparatus 102. In some implementations, and as discussed in greater detail with respect to FIG. 2, a die-based rank controller can also be incorporated into the memory device 108 at any functional position between the interconnect 106 and memory (e.g., memory array or memory dies) of the memory device 108.

As illustrated in FIG. 1, the memory device 108 may include at least one instance of the controller 118 and the associated storage element 120 to implement the die-based rank management. In example implementations, the controller 118 is configured to respond to a command from the host device 104 to access a memory address within the memory device 108. The memory address includes or indicates a rank (e.g., rank selection) that is used to determine which of the memory dies 116 are to be accessed to respond to the command to retrieve or store data stored therein. As described herein, the controller 118 may be adapted to respond to a situation where the rank selection of the memory address specifies a rank of the memory device that includes one or more memory dies 116 that are not functional to store data. For example, if one or more of the memory dies 116 fails a read/write test in which data retrieved from the memory die does not correspond with test data stored therein, the controller 118 may determine that the one or more memory dies 116 are not functional or are unusable during production testing. Additionally or alternatively, the controller 118 or another entity of the apparatus (e.g., memory controller 114) may determine that one or more of the memory dies 116 or a rank of memory dies are not functional or are unusable after a power on or reset if the one or more memory dies 116 fail to operate as intended. In some cases, the controller disables or prevents access to the nonfunctional die(s) and/or enables access to another functional die or other ranks, as further described below.

In response to the controller 118 determining that one or more of the memory dies 116 are nonfunctional, the controller 118 may avoid using the nonfunctional memory die(s) by correlating or mapping a rank selection for the rank with the nonfunctional die(s) to another rank of a viable or functional die. Subsequently, when the memory device 108 is presented with a memory address with the rank selection previously associated with the rank having the nonfunctional die(s), the controller 118 instead directs read or write requests to the rank of functional memory dies that the controller 118 correlates or maps to the rank selection.

In various implementations, the controller 118 is associated with the storage element 120, such as nonvolatile memory, configurable to store information (e.g., a data structure, table, or map) that indicates a correlation or mapping of available rank selections of a memory device or system to physical ranks or memory dies of the memory dies 116. As described herein, the controller 118 may form the correlation or mapping to avoid ranks of nonfunctional memory dies and to enable a memory package to be used with remaining operational dies at less than capacity instead of being discarded. In various implementations, the information or data structure may include a table or a similar structure that enables an entry, such as a rank selection, to be associated with a rank that includes functional memory dies while leaving nonfunctional ranks or memory dies unmapped or disabled. The storage element 120 may include a nonvolatile memory storage circuit, flash memory, or the like. Examples of the information or data structures are described herein with reference to FIG. 4-1 through 4-6, which may be implemented in combination with other aspects of die-based rank management. Although shown as a separate component, the storage element 120 and/or other data structures may be incorporated within the controller 118 rather than existing as a separate entity.

In various aspects, a data structure of the storage element 120 includes entries for one or more rank selections that are mapped to or correlated to respective ranks formed from the memory dies 116. Entries of the data structure may include a rank selection and a rank (e.g., a rank of memory dies) to which the rank selection corresponds or is mapped. For example, a data structure may be populated (e.g., by the controller 118) with a default set of rank selections (e.g., ranks 1-2 or ranks 1-4) exposed by the memory device or accessible through memory addressing into the memory device. The controller 118 or another entity (e.g., external die tester and rank manager) can then configure the rank portion of the entry to indicate which rank or rank of memory dies maps or correlates to the rank selection. In some aspects, the controller 118 or another entity determines whether any ranks or dies of the ranks are not functional or usable to store data, such as through testing performed during fabrication, manufacture, assembly, or the like. The controller 118 or the other entity may then correlate or map functional ranks or memory dies to the rank selections while omitting nonfunctional or unusable ranks or memory dies from the data structure. For example, the controller 118 may associate the rank selection with the rank or memory dies (e.g., functional rank) by storing the rank selection and rank (e.g., physical rank) in adjacent or corresponding entries or records, such as by storing the rank selection in one row or column of a table and the rank of functional memory dies in an adjacent or corresponding row or column of the table. The mapping of rank selections to ranks maintained by the data structure may then be used to route memory commands, via rank selection, to functional ranks while omitting or avoiding ranks that include one or more nonfunctional memory dies. Alternatively or additionally, the controller 118 may disable the nonfunctional rank or memory die, such as by setting the rank to deselect status by configuring a CS status to a non-active state or level. In some cases, the controller 118 may set the nonfunctional rank or die to a power saving mode or low power mode, which may include a deep sleep mode in accordance with a standard (e.g., Low Power DDR 5 (LP5)).

In aspects, the controller 118 may also adaptively redetermine or remap a rank selection to another rank, such as when the controller 118 determines an existing or mapped rank is not functional or is unusable to store data. For example, the controller 118 or another memory controller of an apparatus may determine that a rank or memory die is no longer functional to store data, such as when data cannot be reliably read from the rank or memory die after a reset, wake up, or power on of a memory system of the apparatus. In such cases, the controller 118 can update the data structure or a rank mapping table to remap a rank selection previously mapped to a nonfunctional rank to another rank of functional memory dies. By so doing, die-based rank management may enable the memory system to maintain capacity by deactivating the nonfunctional rank and remapping the rank selection to another rank of functional memory dies.

When enabling memory access, the controller 118 may be presented with a memory address with a rank selection. The controller 118 may then access the data structure in the storage element 120 to determine which physical rank of the memory device corresponds to the rank selection. In some cases, the controller 118 may verify whether the rank selection of the memory address is present in the data structure and, if it is not, may use default routing of memory commands for that rank selection. In aspects, the controller 118 uses the information of the data structure (e.g., rank map) of the storage element 120 to route commands to or responses from the ranks of the memory device based on which of the rank selections corresponds to the rank.

In some cases, the data structure is configured as a lookup table that the controller 118 uses to route memory commands based on rank selection and the corresponding rank to which the rank selection is mapped. Note that if a memory die or rank of a memory device is not functional or is unusable, the mapping of a rank selection to a physical rank of memory may not be direct, sequential, or the like (e.g., rank selection 0 maps to physical rank 1). Generally, the controller 118 handles the routing or redirection of memory commands between a host interface and a physical interface (e.g., PHY) of the ranks or memory dies of the memory device 108. Thus, memory transactions completed between a host and mapped ranks of the memory device are implemented transparently from the host, which may not be aware that rank selections of memory addresses can be mapped indirectly to other ranks or memory dies of the memory device.

In aspects, when one or more of the memory dies 116 of the memory device 108 are not functional or usable to store data, the controller 118 may map available rank selections to other ranks of functional memory dies. By so doing, the memory device or MDP can be configured with fewer ranks of functional memory dies to operate at a lower capacity; however, the memory device may still be functional and usable, avoiding production or yield loss typically associated with memory devices that include a nonfunctional die. Alternatively, a memory device 108 may be configured with a number of extra memory dies 116 to provide a physical storage beyond a stated capacity of the memory device 108. Any subset of these memory dies may be organized into ranks and mapped as described herein, such that the memory device 108 may operate at a stated or a full capacity despite one or more of the memory dies 116 being not functional or unusable for memory operations.

Example Techniques and Hardware

Figures 1, 2:
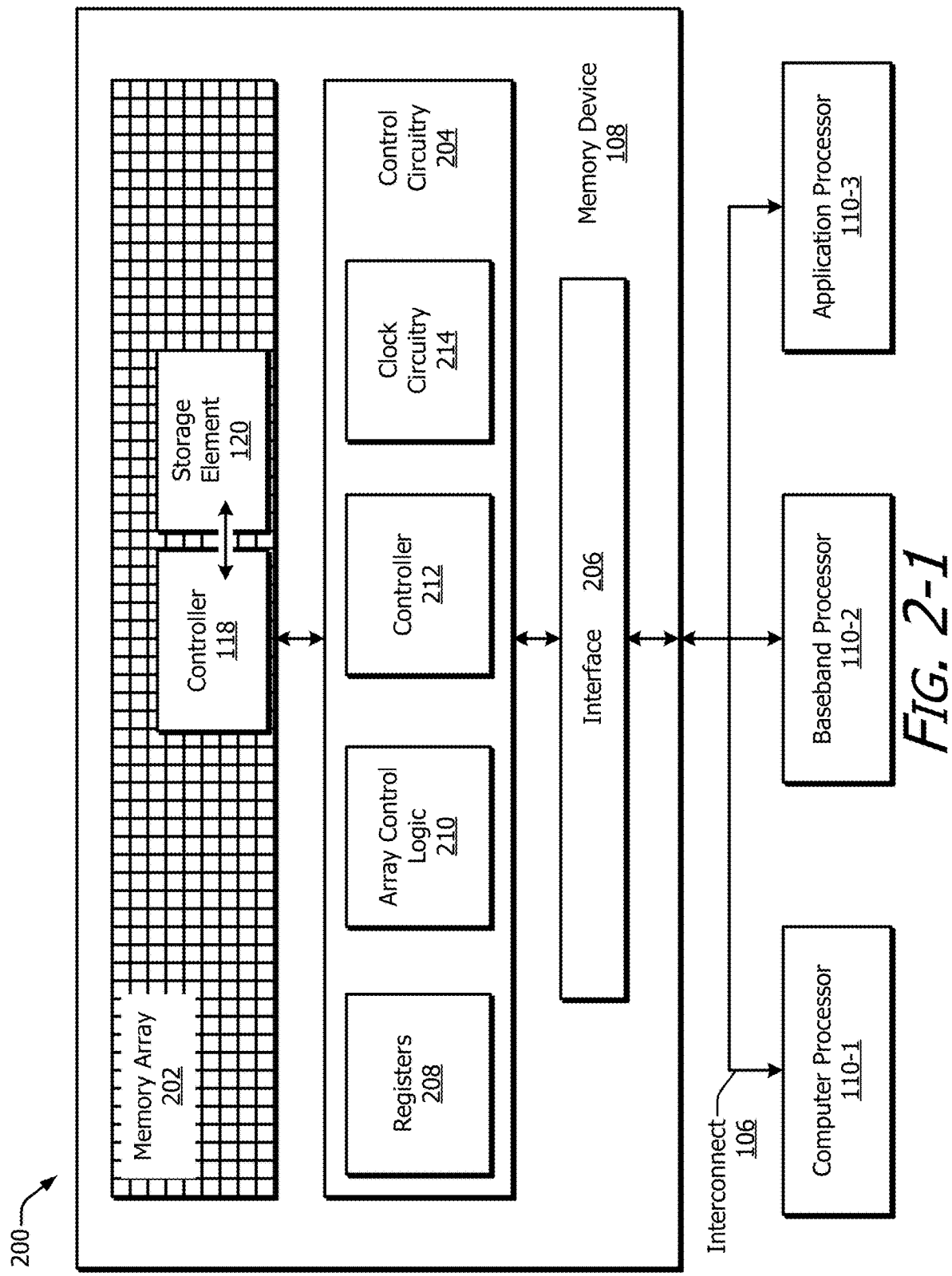
Figure 2:
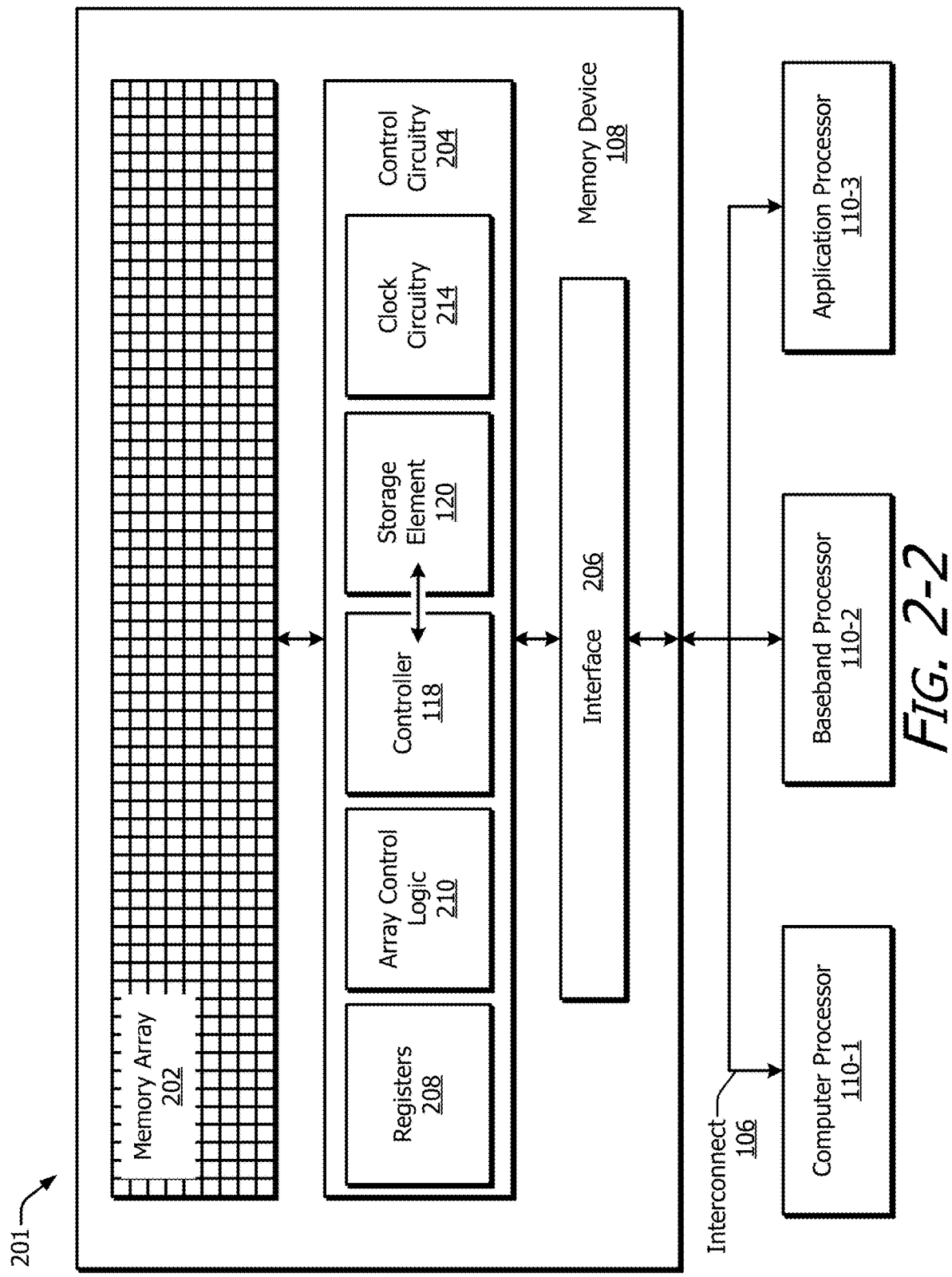

FIGS. 2-1 and 2-2 illustrate at 200 and 201, respectively, example computing systems with memory systems in which die-based rank management may be implemented in accordance with various aspects. In these examples, the computing system 200 of FIG. 2-1 includes a memory device 108 in which a controller 118 and storage element 134 are implemented in association with a memory array 202 in accordance with one or more aspects. With reference to FIG. 2-2, the example computing system 201 includes a memory device 108 in which a controller 118 and storage element 120 are implemented in association with control circuitry 204 of the memory device 108. The illustrated configurations of the computing systems 200 and 201 are presented as examples, and various components of the computing systems 200 and 201 may be organized in any suitable combination to implement various aspects of die-based rank management.

In addition to the memory device 108, the computing systems may include the control circuitry 204 operatively coupled with the memory array 202 and an interface 206 to enable operative coupling with a host or processor 110. By way of example, the memory device 108 may correspond to one or more of a cache memory, a main memory, a backing memory, or a storage memory, such as those described with reference to FIG. 1. Although not shown, the memory array 202 can include or be configured as any suitable number of memory dies 116, which in turn may be organized into respective ranks of one or more of the memory dies 116. Thus, the memory array 202 can include an array of memory devices, memory dies, or ranks, including but not limited to memory devices of DRAM, SDRAM, 3D stacked DRAM, DDR memory, low-power DRAM, or LPDDR SDRAM. For example, the memory array 202 can include memory cells of SDRAM configured as a memory module with one channel containing either 16 or 8 data (DQ) signals, DDR I/O signaling, and/or supporting a supply voltage of 0.3 V to 0.5 V. The memory array 202 may be configured with any suitable density, which can range, for instance, from 2 Gb to 32 Gb. The memory array 202 and the control circuitry 204 may be implemented as components on a single semiconductor die within a single package, as components on a single semiconductor die within a package of multiple interconnected dies, or as one of many components disposed across multiple interconnected dies or packages.

The control circuitry 204 can include various components that the memory device 108 uses to perform various operations. These operations can include communicating with other devices, managing memory performance, performing refresh operations (e.g., self-refresh operations or auto-refresh operations), and performing memory read or write operations. For example, the control circuitry 204 can include one or more registers 208, at least one instance of array control logic 210, at least one controller 212, and at least one instance of clock circuitry 214. When the memory array 202 includes DRAM devices, the control circuitry 204 also may include refresh control logic (not shown) to refresh charges representing stored data values, as will be appreciated by one skilled in the art of DRAM devices.

The interface 206 may couple the control circuitry 204 or the memory array 202, respectively, directly or indirectly to an interconnect 106. As shown in FIGS. 2-1 and 2-2, the registers 208, the array control logic 210, the controller 212, and the clock circuitry 214 can be part of a single component (e.g., the control circuitry 204). In other implementations, one or more of the registers 208, the array control logic 210, the controller 212, and the clock circuitry 214 may be separate components of a single package or distributed across multiple interconnected packages. These components may individually or jointly couple to the interconnect 106 via the interface 206.

The interconnect 106 may use one or more of a variety of interconnects that communicatively couple together various components and enable commands, addresses, data, or other information to be transferred between two or more components (e.g., between the processor 110 and the memory device 108 of FIG. 2-1 or FIG. 2-2). Although the interconnect 106 is illustrated as a single entity in FIGS. 2-1 and 2-2, the interconnect 106 may include at least one bus, at least one switching fabric, one or more wires or traces that carry voltage or current signals, at least one switch, one or more buffers, and so forth. Further, the interconnect 106 may be separated into or represent at least a CA bus 122 and a DQ bus 124 (as illustrated in FIG. 1). As discussed above with respect to FIG. 1, the interconnect 106 can include a CXL link or comport with at least one CXL standard. The CXL link can provide an interface or overlay on top of the physical layer and electrical signaling of the PCIe 5.0 physical layer.

In some aspects, the memory device 108 of FIG. 2-1 or FIG. 2-2 may be a "separate" component relative to the host device 104 (of FIG. 1) or any of the processors 110. The separate components can include a PCB, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processors 110-1 through 110-3, by being combined on a PCB or in a single package or an SoC.

The described apparatuses and methods may be appropriate for memory designed for lower-power operations or energy-efficient applications. An example of a memory standard related to low-power applications is the LPDDR standard for SDRAM as promulgated by the Joint Electron Device Engineering Council (JEDEC) Solid State Technology Association. In this document, some terminology may draw from one or more of these standards or versions thereof, such as the LPDDR5 standard, for clarity. The described principles, however, are also applicable to memories that comport with other standards, including other LPDDR standards (e.g., earlier versions or future versions such as LPDDR6), and they are applicable to memories that do not adhere to a standard.

As shown at 200 or 201, the computing system may include a computer processor 110-1, a baseband processor 110-2, and/or an application processor 110-3 that is coupled to the memory device 108 through the interconnect 106. The processors 110-1 through 110-3 may include or form a part of a CPU, a GPU, an SoC, an ASIC, or an FPGA. In some cases, a single processor can comprise multiple processing resources, each dedicated to different functions (e.g., modem management, applications, graphics, central processing). In some implementations, the baseband processor 110-2 may include or be coupled to a modem (not illustrated in FIG. 2) and be referred to as a modem processor. The modem or the baseband processor 110-2 may be coupled wirelessly to a network via, for example, cellular, Wi-Fi®, Bluetooth®, near field, or another technology or protocol for wireless communication.

In some implementations, the processors 110-1 through 110-3 may be connected directly to the memory device 108 (e.g., via the interconnect 106). In other implementations, one or more of the processors 110-1 through 110-3 may be indirectly connected to the memory device 108 (e.g., over a network connection or through one or more other devices). Further, any of the processors 110-1 through 110-3 may be realized as one that can communicate over a CXL-compatible interconnect. Accordingly, processors 110-1 through 110-3 can include or be associated with respective link controllers. Alternatively, two or more of the processors 110-1 through 110-3 may access the memory device 108 using a shared link controller. In some of such cases, the memory device 108 may be implemented as a CXL-compatible memory device (e.g., as a CXL Type 3 memory expander), or another memory device 108 that is compatible with a CXL protocol may also or instead be coupled to the interconnect 106.

In reference to FIG. 2-1, the controller 118 and storage element 120 are incorporated within the memory array 202. As such, the controller 118 may implement aspects of die-based rank management in ways that are transparent to the processors 110-1 through 110-3, the interconnect 106, and other components of the memory device 108 outside of the memory array 202. For example, the controller 118 may determine which memory dies of the memory array 202 are not functional to store data and correlate rank selections of the memory device with ranks of other memory dies (e.g., functional memory dies) of the memory array. The controller 118 may then store information that indicates the correlation or mapping of the rank selections of the memory device 108 (e.g., exposed via the interface 206) to the ranks of the other memory dies to enable access to those ranks of the memory device. In some aspects, the controller 118 (or controller 212) receives a command via the interface 206 to access the memory device with a rank selection, and the controller enables access to the corresponding rank based on the information. In other words, die-based rank management remaps rank selections that would typically be associated with ranks including one or more unusable memory dies to ranks of functional memory dies to provide an operational memory device.

In reference to FIG. 2-2, the controller 118 and storage element 120 are implemented separately from the memory array 202 and shown as part of the control circuitry 204, which may be modified to include and/or interact with the controller 118 and storage element 120. In this configuration, the controller 118 may interact with memory dies of the memory array 202, the control circuitry 204, or the interface 206 to implement aspects of die-based rank management as described herein. For example, the controller 118 may remap rank selection of the memory device 108 to functional ranks of the memory array 202 (e.g., avoiding nonfunctional memory dies), store the rank selection mapping information in the storage element 120 (e.g., as a lookup table), and route rank selections of memory addresses presented via the interface 206 to remapped ranks of the memory array 202 to enable completion of memory access operations. As described herein, the implementation of die-based rank management by the controller 118 may be transparent to the processors 110-1 through 110-3, the host device 104, the interconnect 106, and logic of the memory array 202.

Figures 1, 3:
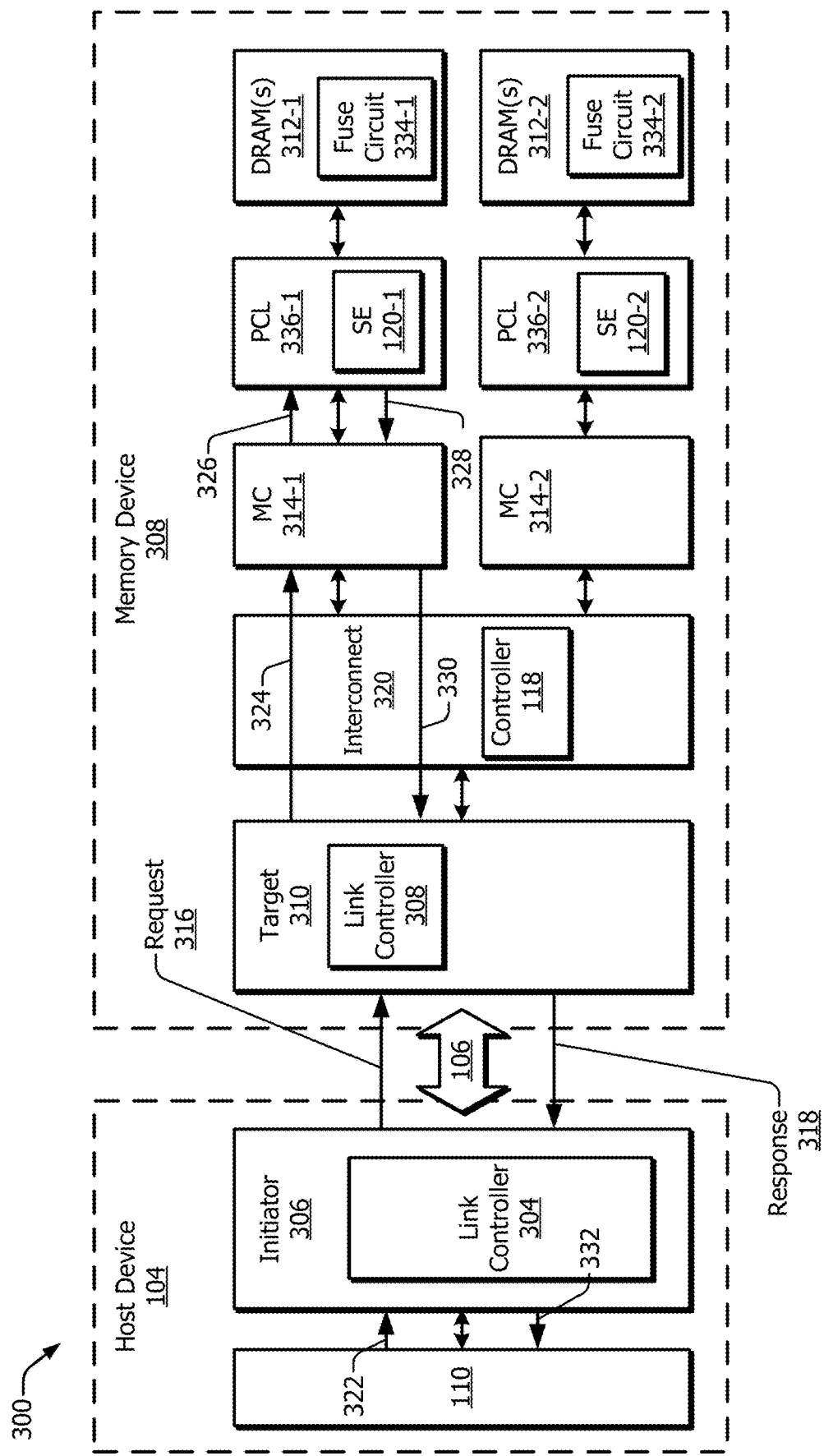
Figures 2, 3:
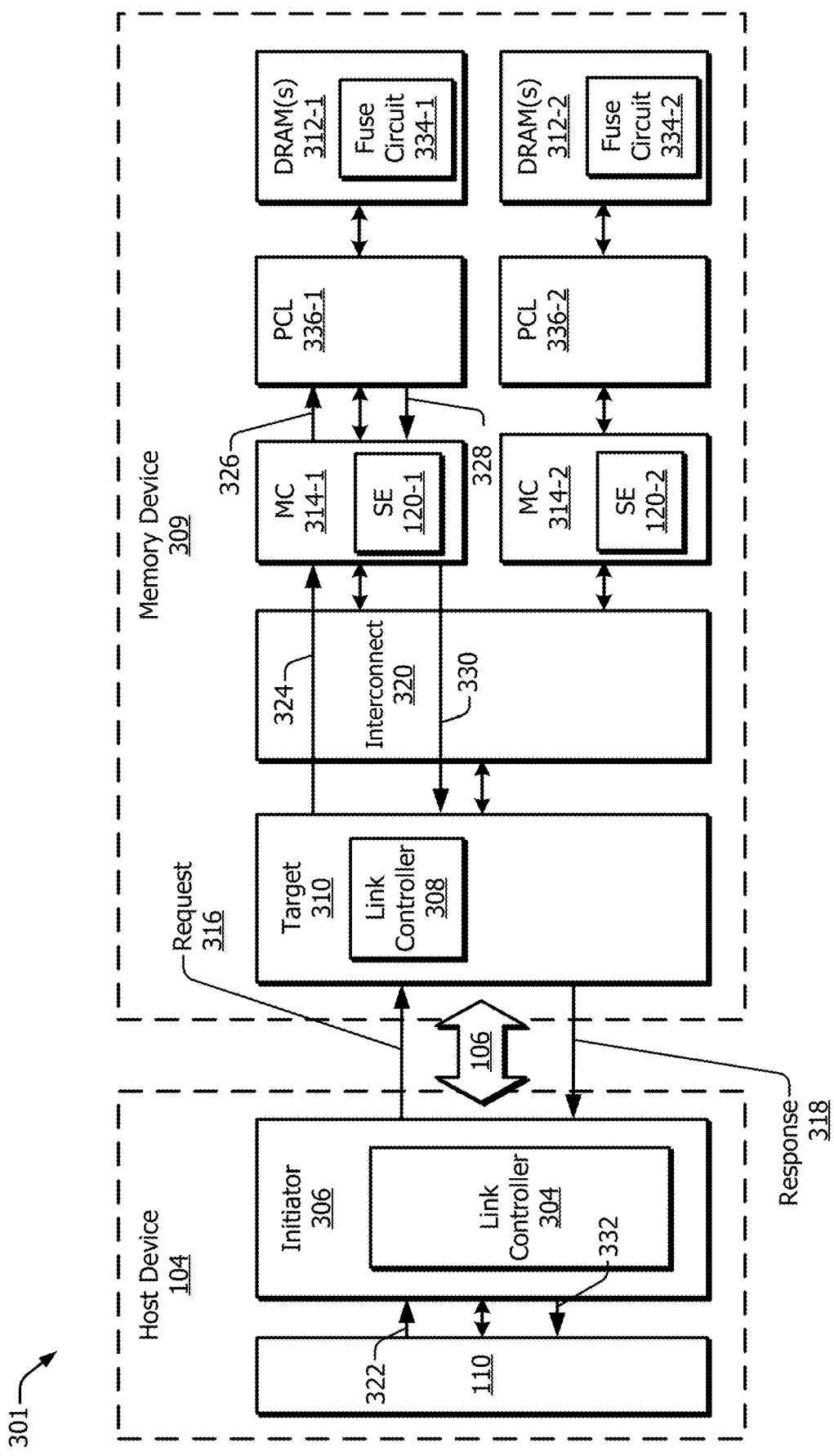
Figure 3:
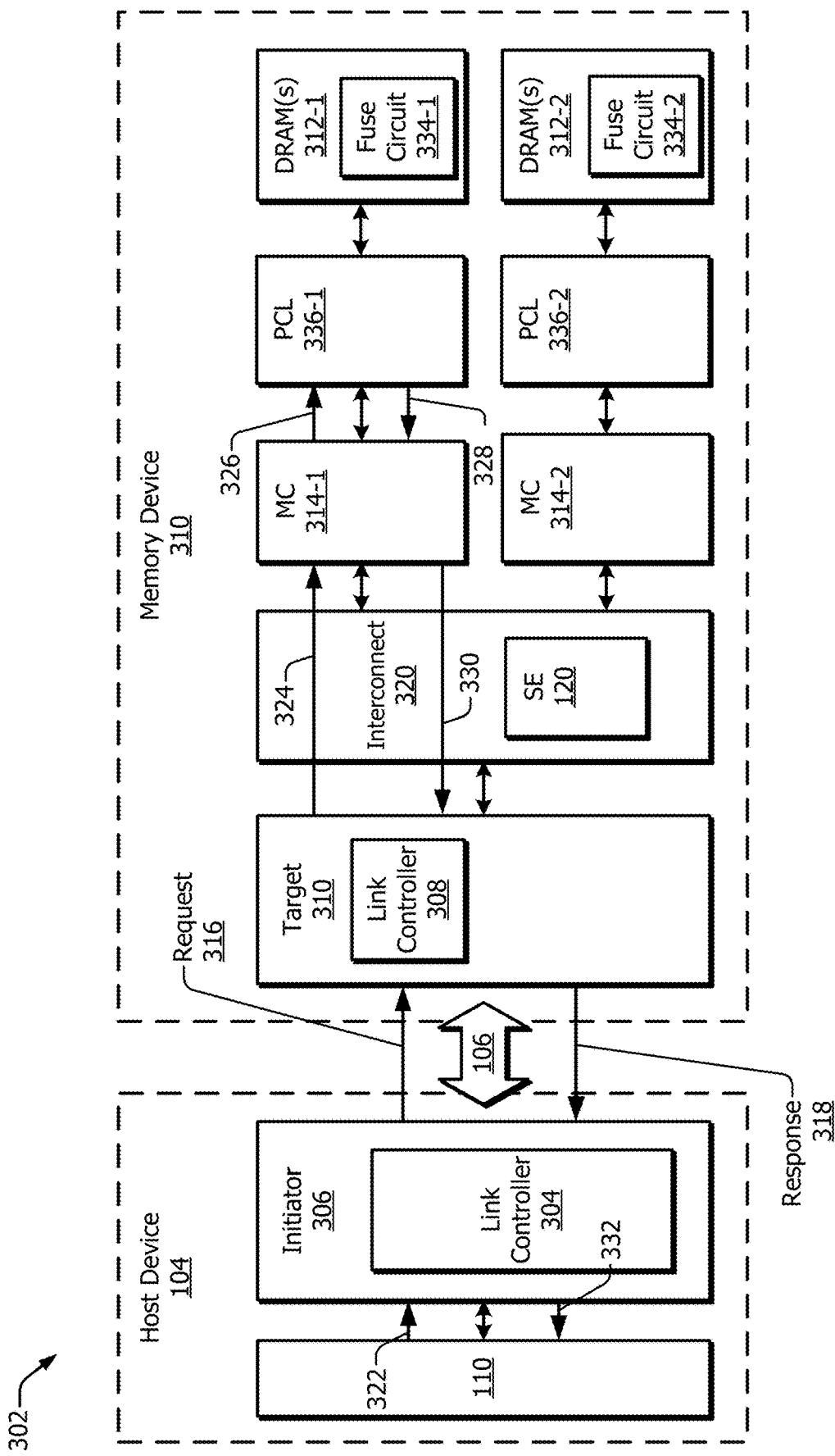

FIGS. 3-1 through 3-3 illustrate at 300 through 302, respectively, example implementations of die-based rank management in the context of controllers that enable various DRAM operations or access in accordance with one or more aspects. Generally, memory systems shown at 300, 301, or 302 may implement aspects of die-based rank management to correlate or map rank selections of a memory device to ranks of functional memory dies while avoiding one or more ranks including a memory die that is not functional or is unusable to store data. Each of the systems 300, 301, and 302 includes a respective host device 104 and a memory device 108 that are coupled together via an interconnect 106. In some cases, the system 300, 301, or 302 forms at least part of an apparatus 102 (as shown in FIG. 1). As illustrated, the host device 104 includes a processor 110 and a link controller 304, which can be realized in association with at least one initiator 306. Thus, the initiator 306 can be coupled to the processor 110 and/or the interconnect 106, and it can be coupled between the processor 110 and the interconnect 106.

Examples of initiators 306 may include a leader, a primary, a master, a main component, and so forth.

In the illustrated example systems 300 through 302, each of the memory device (e.g., memory device 108) includes a link controller 308, which may be realized in association with at least one target 310. The target 310 of the memory device 108 can be coupled directly or indirectly to the interconnect 106. Thus, the target 310 and the initiator 306 can be coupled to each other via the interconnect 106. Examples of targets 310 may include a follower, a secondary, a slave, a responding component, and so forth. The memory device also includes a memory, which may be realized with at least one memory module or other component, such as one or more DRAMs 312 (e.g., DRAM 312-1 and DRAM 312-2) and one or more memory controllers 314 (e.g., MC 314-1 and MC 314-2), as described further below.

In example implementations, the initiator 306 includes the link controller 304, and the target 310 includes the link controller 308. The link controller 304 or the link controller 308 can instigate, coordinate, cause, or otherwise control signaling across a physical or logical link realized by the interconnect 106 in accordance with one or more protocols. The link controller 304 may be coupled to the interconnect 106. The link controller 308 may also be coupled to the interconnect 106. Thus, the link controller 304 can be coupled to the link controller 308 via the interconnect 106. Each link controller 304 or 308 may, for instance, control communications over the interconnect 106 at a link layer or at one or more other layers of a given protocol. Communication signaling may include, for example, a request 316 (e.g., a write or read request), a response 318 (e.g., a write or read response), and so forth.

The respective memory devices 108 of the systems 301 through 302 may further include at least one interconnect 320 and the at least one memory controller 314 (e.g., MC 314-1 and MC 314-2). Within the memory device 108 and relative to the target 310, the interconnect 320, memory controller 314, and/or DRAM 312 (or other memory component) may be referred to as a "backend" component of the memory device 314. In some cases, the interconnect 320 is internal to the memory device 108 and may operate in a manner the same as or different from that of the interconnect 106.

As shown, the memory devices 108 may include multiple memory controllers 314-1 and 314-2 and/or multiple DRAMs 312-1 and 312-2. Although two of each are shown, the memory device 108 may include one or more memory controllers and/or one or more DRAMs. For example, the memory device 108 may include four memory controllers and 16 DRAMs, such as four DRAMs, channels, or dies per memory controller. The memory components of the memory device 108 are depicted as DRAM only as an example, for one or more of the memory components may be implemented as another type of memory. For instance, the memory components may include nonvolatile memory such as flash or PCM. Alternatively, they may include other types of volatile memory, such as static random-access memory (SRAM). The memory device 108 may also include any combination of memory types.

In some cases, the memory devices 108 may include the target 310, the interconnect 320, the at least one memory controller 314, and the at least one DRAM 312 on a single MDP or within a single housing or another enclosure. The enclosure, however, may be omitted or may be merged with an enclosure for the host device 104, the system 300, 301, or 302, or the apparatus 102 (of FIG. 1). The interconnect 320 can be incorporated within a multiple die package to interconnect different dies or components within a package on a PCB. Each of the target 310, the memory controller 314, and the DRAM 312 may be fabricated on at least one package or in separate packages. In either case, the package or packages may be supported by the PCB and may be directly or indirectly coupled to the interconnect 320. In some cases, the package or packages may be coupled to a PCB, and one or more modules for the memory components (e.g., for the DRAM 312) may be coupled to the same PCB, which can form a CXL type of memory device 108. This memory device 108 may be enclosed within a housing or may include such a housing. The components of the memory device 108 may, however, be fabricated, packaged, combined, and/or housed in other manners.

As illustrated in FIGS. 3-1 through 3-3, the target 310, including the link controller 308 thereof, can be coupled to the interconnect 320. Each memory controller 314 of the multiple memory controllers 314-1 and 314-2 can also be coupled to the interconnect 320. Accordingly, the target 310 and each memory controller 314 of the multiple memory controllers MC 314-1 and MC 314-2 can communicate with each other via the interconnect 320. Each memory controller 314 is coupled to at least one DRAM 312. As shown, each memory controller 314 of the multiple memory controllers MC 314-1 and MC 314-2 is coupled to at least one respective DRAM 312 of the multiple DRAMs 312-1 and 312-2. Each memory controller 314 of the multiple memory controllers MC 314-1 and MC 314-2 may, however, be coupled to a respective set of multiple DRAMs 312 or other memory components.

Each memory controller 314 can access at least one DRAM 312 by implementing one or more memory access protocols to facilitate reading or writing data based on at least one memory address. The memory controller 314 can increase bandwidth or reduce latency for the memory accessing based on the memory type or organization of the memory components, like the DRAMs 312. The multiple memory controllers MC 314-1 and MC 314-2 and the multiple DRAMs 312-1 and 312-2 can be organized in many different manners. For example, each memory controller 314 can realize one or more memory channels for accessing the DRAMs 312. Further, the DRAMs 312 can be manufactured to include one or more ranks, such as in a single-rank or a dual-rank memory module. Each of the DRAMs 312 may also include multiple banks, such as 8 or 16 banks.

This document now describes examples of the host device 104 accessing the memory device 108 of the system 300, 301, or 302 in accordance with one or more aspects. The examples are described in terms of a general access, which may include a memory read access (e.g., a retrieval operation) or a memory write access (e.g., a storage operation). The processor 110 can provide a memory access request 322 to the initiator 306. The memory access request 322 may be propagated over a bus or another interconnect that is internal to the host device 104. This memory access request 322 may be or may include a read or write request. The initiator 306, including the link controller 304 thereof, can reformulate the memory access request into a format that is suitable for the interconnect 106. This formulation may be performed based on a physical and/or a logical protocol applicable to the interconnect 106.

The initiator 306 can thus prepare the request 316 and transmit the request 316 over the interconnect 106 to the target 310. The target 310 receives the request 316 from the initiator 306 via the interconnect 106. The target 310, including the link controller 308 thereof, can process the request 316 to determine (e.g., extract or decode) the memory access request. Based on the determined memory access request, the target 310 can forward a memory request 324 over the interconnect 320 from the memory controller 314, which is the first memory controller 314-1 in this example, to the first DRAM 312-1. For other memory accesses, the targeted data may be accessed with the second DRAM 312-2 through the second memory controller 314-2.

The first memory controller MC 314-1 can prepare a memory command 326 based on the memory request 324. MC 314-1 can provide the memory command 326 to the DRAM 312-1 over an interface or interconnect appropriate for the type of DRAM or other memory component. The DRAM 312-1 receives the memory command 326 from MC 314-1 and can perform the corresponding memory operation. The memory command 326 and corresponding memory operation may pertain to a read operation, a write operation, a refresh operation, and so forth. On the basis of the results of the memory operation, the DRAM 312-1 can generate a memory response 328. If the memory request 316 is for a read operation, the memory response 328 can include the requested data. If the memory request 316 is for a write operation, the memory response 328 can include an acknowledgment that the write operation was performed successfully. The DRAM 312-1 can return the memory response 328 to MC 314-1.

MC 314-1 receives the memory response 328 from the first DRAM 312-1. Based on the memory response 328, MC 314-1 can prepare a memory response 330 and transmit the memory response 330 to the target 310 via the interconnect 320. The target 310 receives the memory response 330 from MC 314-1 via the interconnect 320. Based on this memory response 330, and in response to the corresponding request 316, the target 310 can formulate the response 318 for the requested memory operation. The response 318 can include read data or a write acknowledgment and can be formulated in accordance with one or more protocols of the interconnect 106.

To respond to the memory request 316 from the host device 104, the target 310 can transmit the response 318 to the initiator 306 over the interconnect 106. Thus, the initiator 306 receives the response 318 from the target 310 via the interconnect 106. The initiator 306 can therefore respond to the "originating" memory access request 322, which is from the processor 110 in this example. To do so, the initiator 306 prepares a memory access response 332 using the information from the response 318 and provides the memory access response 332 to the processor 110. In this way, the host device 104 can obtain memory access services from the memory device 108 using the interconnect 106.

The interconnect 106 can be implemented in a myriad of manners to enable the exchange of memory-related communications between the initiator 306 and the target 310. Generally, the interconnect 106 can carry memory-related information, such as data or a memory address, between the initiator 306 and the target 310. In some cases, the initiator 306 and/or target 310 can prepare memory-related information for communication across the interconnect 106 by encapsulating such information. The memory-related information can be encapsulated into, for example, at least one packet (e.g., a flit). One or more packets may include headers with information indicating or describing the content of each packet.

In example implementations, the interconnect 106 can support, enforce, or enable memory coherency for a shared memory system, for a cache memory, for combinations thereof, and so forth. Additionally or alternatively, the interconnect 106 can be operated on the basis of a credit allocation system. Possession of a credit can enable an entity, such as the initiator 306, to transmit another memory request 316 to the target 310. The target 310 may return credits to "refill" a credit balance at the initiator 306. A credit-based communication scheme across the interconnect 106 may be implemented by credit logic of the target 310 or credit logic of the initiator 306 (including by both working together in tandem).

The systems 300, 301, or 302, using the initiator 306 of the host device 104 or the target 310 of the respective memory devices 108, may operate or interface with the interconnect 106 in accordance with one or more physical or logical protocols. For example, the interconnect 106 may be built in accordance with a Peripheral Component Interconnect Express (PCIe or PCI-e) standard. Applicable versions of the PCIe standard may include 1.x, 2.x, 3.x, 4.0, 5.0, 6.0, and future or alternative versions. In some cases, at least one other standard is layered over the physical-oriented PCIe standard. For example, the initiator 306 or the target 310 can communicate over the interconnect 106 in accordance with a Compute Express Link (CXL) standard. Applicable versions of the CXL standard may include 1.x, 2.0, and future or alternative versions. The CXL standard may operate based on credits, such as read credits and write credits. In such implementations, the link controllers 304 and 308 can be CXL controllers.

As also illustrated in FIGS. 3-1 through 3-3, the DRAMs 312 may include fuse circuits 334, such as fuse circuit 334-1 included in the DRAM 312-1 and fuse circuit 334-2 included in the DRAM 312-2. The fuse circuits 334 may store or otherwise maintain a value indicating whether the associated DRAM 312 is functional or usable to store data or not functional or unusable to store data. During fabrication or production testing, following a power-up, or after a reset, the fuse circuits 334 may be set based on whether memory dies of the associated DRAMs 312 are determined to be functional or nonfunctional. The fuse circuits 334 may include nonvolatile memory cells, such as flash memory cells, or laser-severable or voltage-programmable cells to maintain the value indicating the usability or unusability of the memory dies of the associated DRAMs 312. Any of the DRAMs 312 memory dies or ranks found to be unusable may be disabled or otherwise avoided using implementations of die-based rank management as described herein.

The memory devices 108 may incorporate logic or controllers that implement die-based rank management. With reference to FIG. 3-1, in the memory device 108, physical control logic (PCL) 336-1 and 336-2 associated with the DRAMs 312-1 and 312-2 may also include an instance of a storage element (SE) 120-1 and 120-2, respectively. Using the correlations or mapping as described herein, the physical control logic 336 correlates or maps a rank selection within the DRAM 312 that would normally map to or be associated with a rank of one or more unusable dies with another rank within the DRAM 312 including functional or usable dies that will be used in place of the unusable dies. When a memory address including the rank selection is received by the respective physical control logic 336, the physical control logic 336 accesses the associated storage element 120 to determine if the rank selection is correlated with or mapped to another rank. If so, the physical control logic 336 accesses the rank correlated with or mapped to the rank selection instead of using the default or previously mapped rank to avoid the unusable die or dies. Thus, on the basis of the information in the storage element 120, the physical control logic 336 routes a memory request for the rank selection to another rank of the DRAM 312 with functional or usable memory dies (i.e., avoiding the rank that includes a non-functional memory die).

In various aspects, components that implement die-based rank management may be incorporated within other logic or controllers. With reference specifically to FIG. 3-2, in the memory device 108 of system 301, the one or more memory controllers (MC) 314 that interoperate with the interconnect 320 and the physical control logic 336 may be configured to implement die-based rank management. In some cases, the memory controllers 314-1 and 314-2 include storage elements 120-1 and 120-2, respectively. Using the correlations or mapping as described herein, the memory controllers 314 correlate or map a rank selection within the DRAM 312 that typically maps to a rank having one or more unusable dies to another rank within the DRAM 312 including functional or usable dies that will be used in place of the rank of unusable dies. When a memory address including the rank selection is received by the respective memory controller 314, the memory controller 314 accesses the storage element 120 to determine if the rank selection is correlated with or mapped to another rank. If so, the memory controller 314 accesses the rank correlated with or mapped to the rank selection instead of using the rank selection (e.g., default or direct mapping) to avoid the rank with the unusable die or dies. Thus, the memory controller 314 remaps the rank selection from the rank with the unusable die or dies to another rank of usable memory dies. Although this remapping may result in a memory device of reduced capacity (e.g., fewer functional ranks), the memory device is operational and functional, thereby preventing the memory device from being discarded due to having one or more nonfunctional memory dies.

In FIG. 3-3, the system 302 may be configured to implement die-based rank management within or from the interconnect 320—or any other logic or controllers within the memory device 108—which interoperates with the target 310 or link controller 308 and/or the memory controllers 314. The interconnect 320 of the system 302 may include a storage element 120 that stores information describing a mapping of rank selections to ranks of the DRAMs 312. Using the correlations or mapping as described herein, the interconnect 320 or associated logic can correlate or map a rank selection within the DRAM 312 that normally maps to a rank that may include an unusable memory die (e.g., determined during testing) to another rank within the DRAM 312 including functional memory dies that will be used in place of the rank of the unusable die. When a memory address including a rank selection is received by the interconnect 320, the memory controller 314 accesses the associated storage element 120 to determine if the rank selection is correlated with or mapped to another rank. If so, to avoid the unusable die or dies, the interconnect 320 accesses the rank correlated with or mapped to the rank selection instead of using the default or previous rank selection. Thus, the interconnect 320 replaces, for that rank selection, the unusable rank of one or more faulty memory dies with the rank of functional memory dies (e.g., redirecting to the functional rank). It will be appreciated that implementation of aspects of die-based rank management within the PCLs 336, memory controllers 314, or interconnect 320 are presented by way of example only and that the die-based rank management, with an associated storage element, could be implemented in separate, additional devices or in other logic or controllers within the host device 104 or the respective memory devices 108 described in reference to FIGS. 3-1 through 3-3.

FIGS. 4-1 through 4-6 illustrate at 400 through 405 various example implementations of die-based rank management in which a controller manages a mapping of rank selections to ranks of memory dies in accordance with one or more aspects. Although aspects of die-based rank management logic may be implemented with a physical control logic, memory controllers, or other control devices as previously described, for the sake of continuity, the following examples described with reference to FIGS. 4-1 through 4-6 depict operations of the die-based rank management within one or more controllers 118 of a memory module 406 in direct communication with components including multiple ranks 408 of memory dies 410. As previously described, however, aspects of die-based rank management may be implemented by, in combination with, or through components other than the controllers 118.

Figures 1, 4:
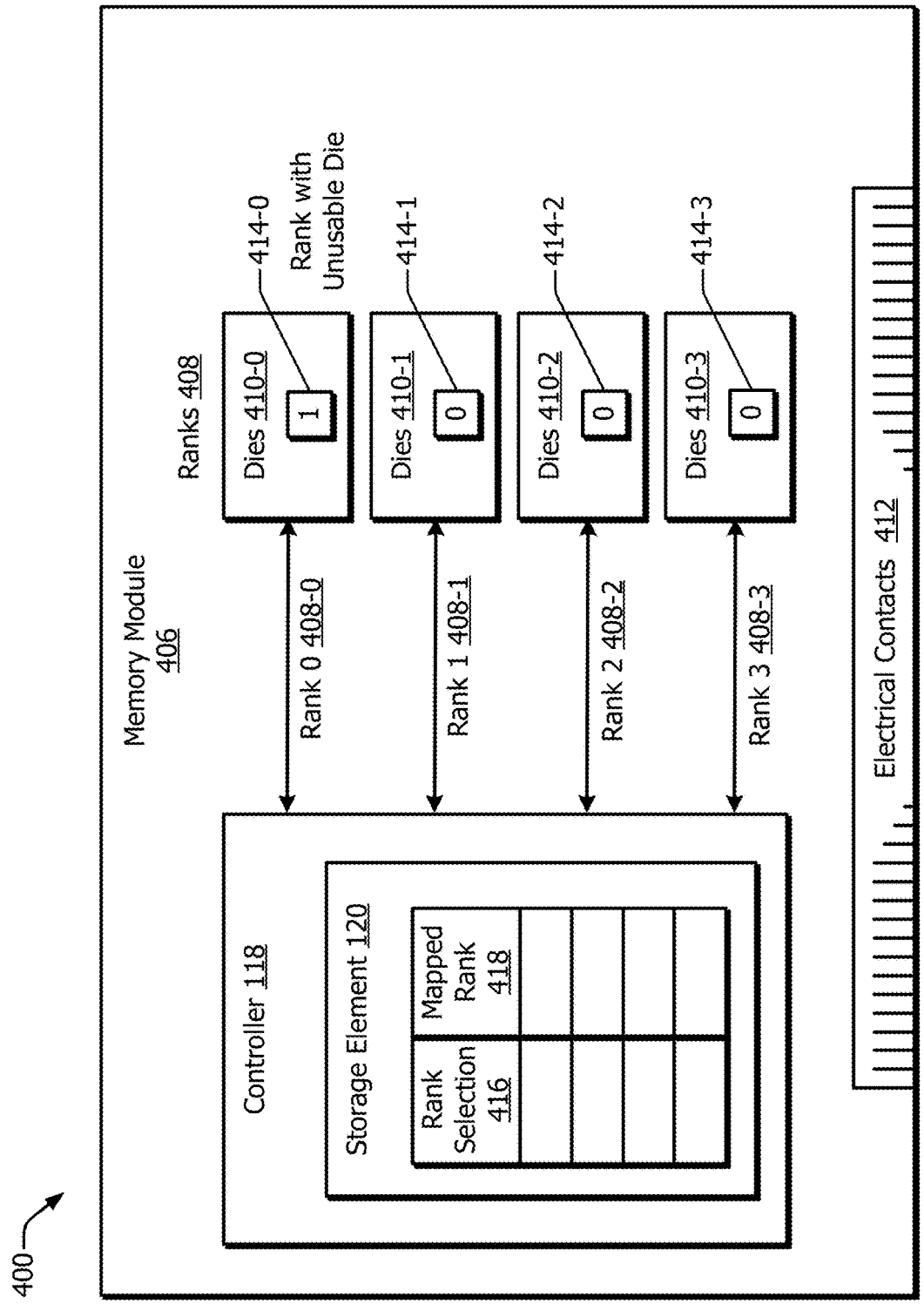
Figures 2, 4:
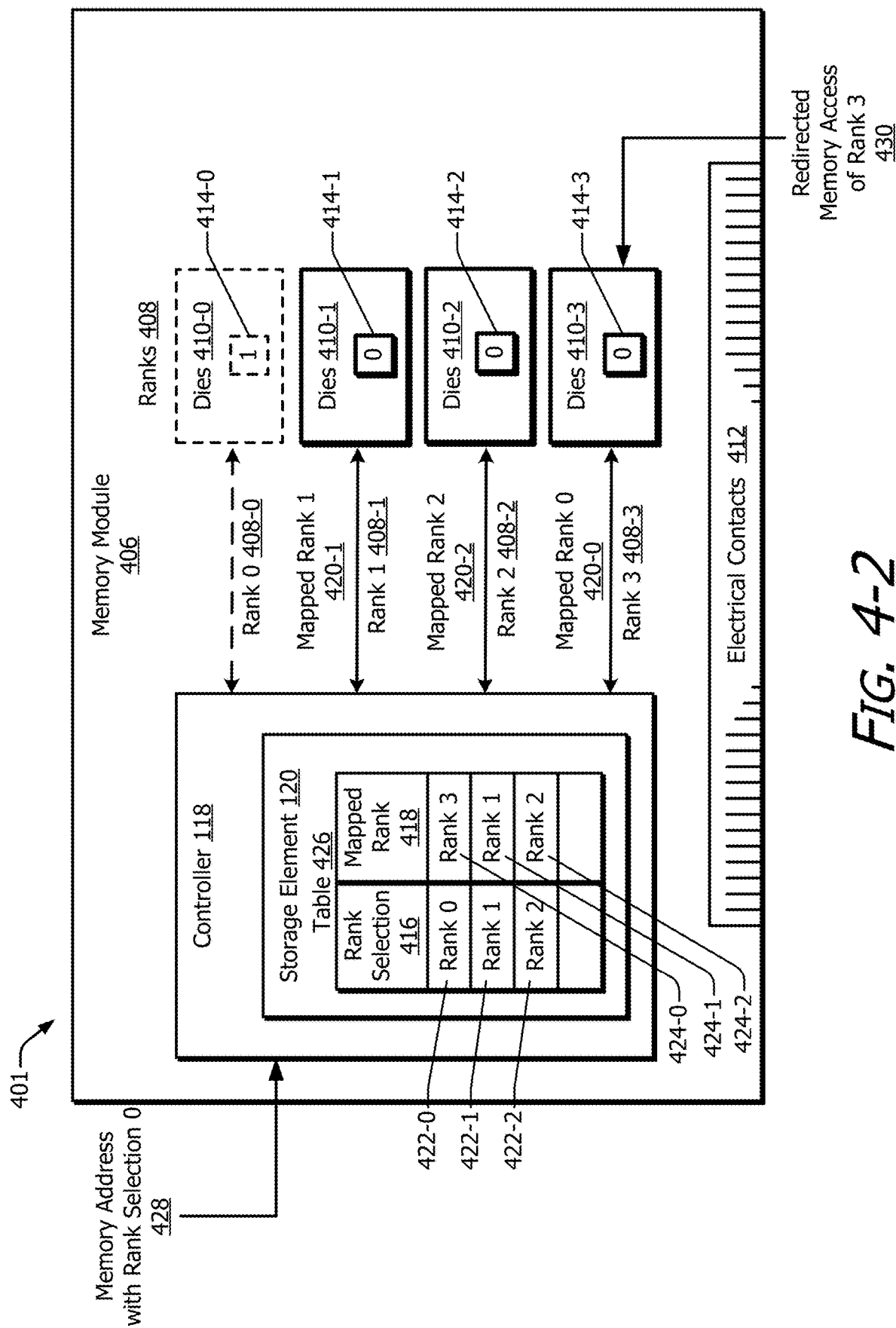
Figures 3, 4:
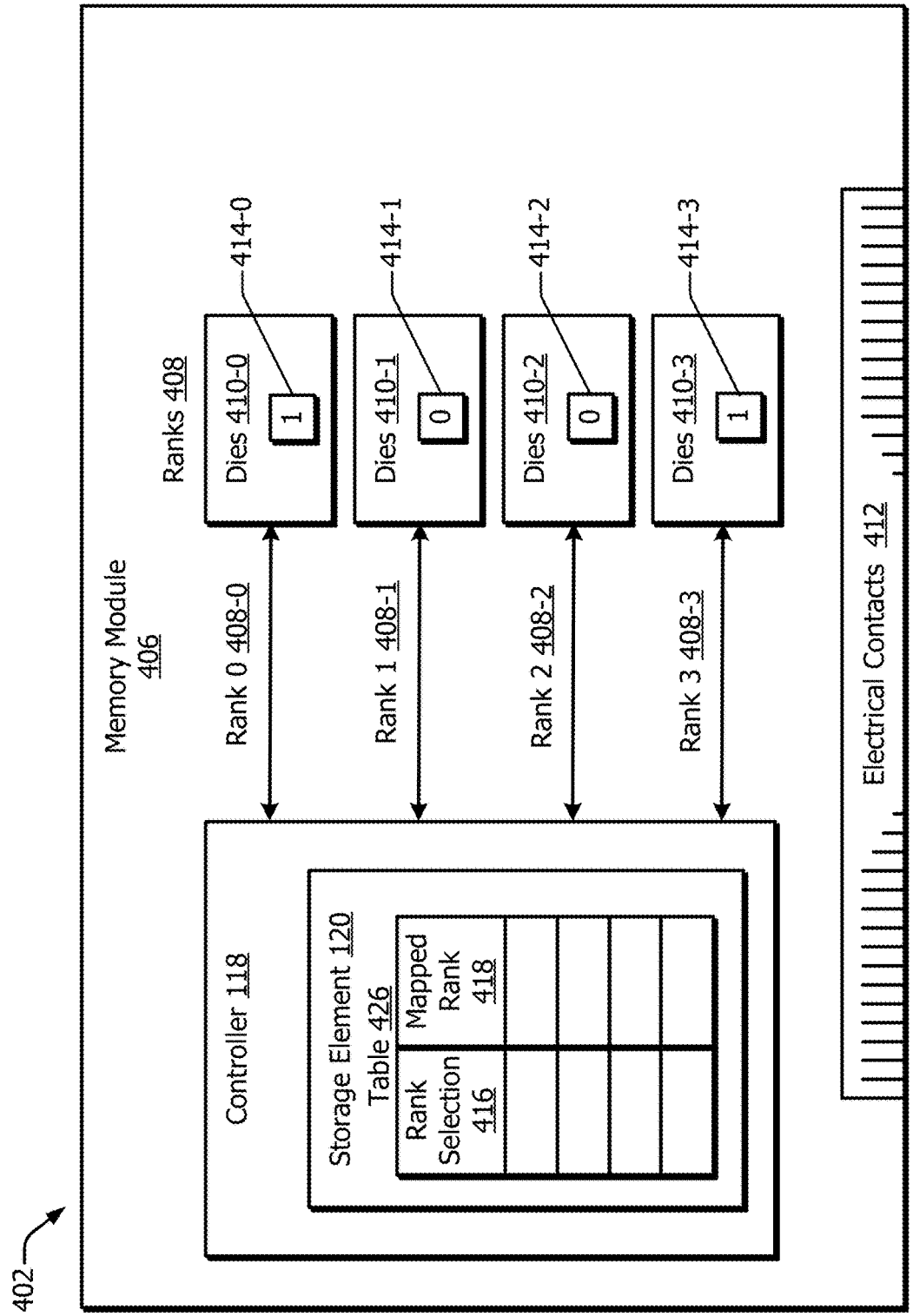
Figure 4:
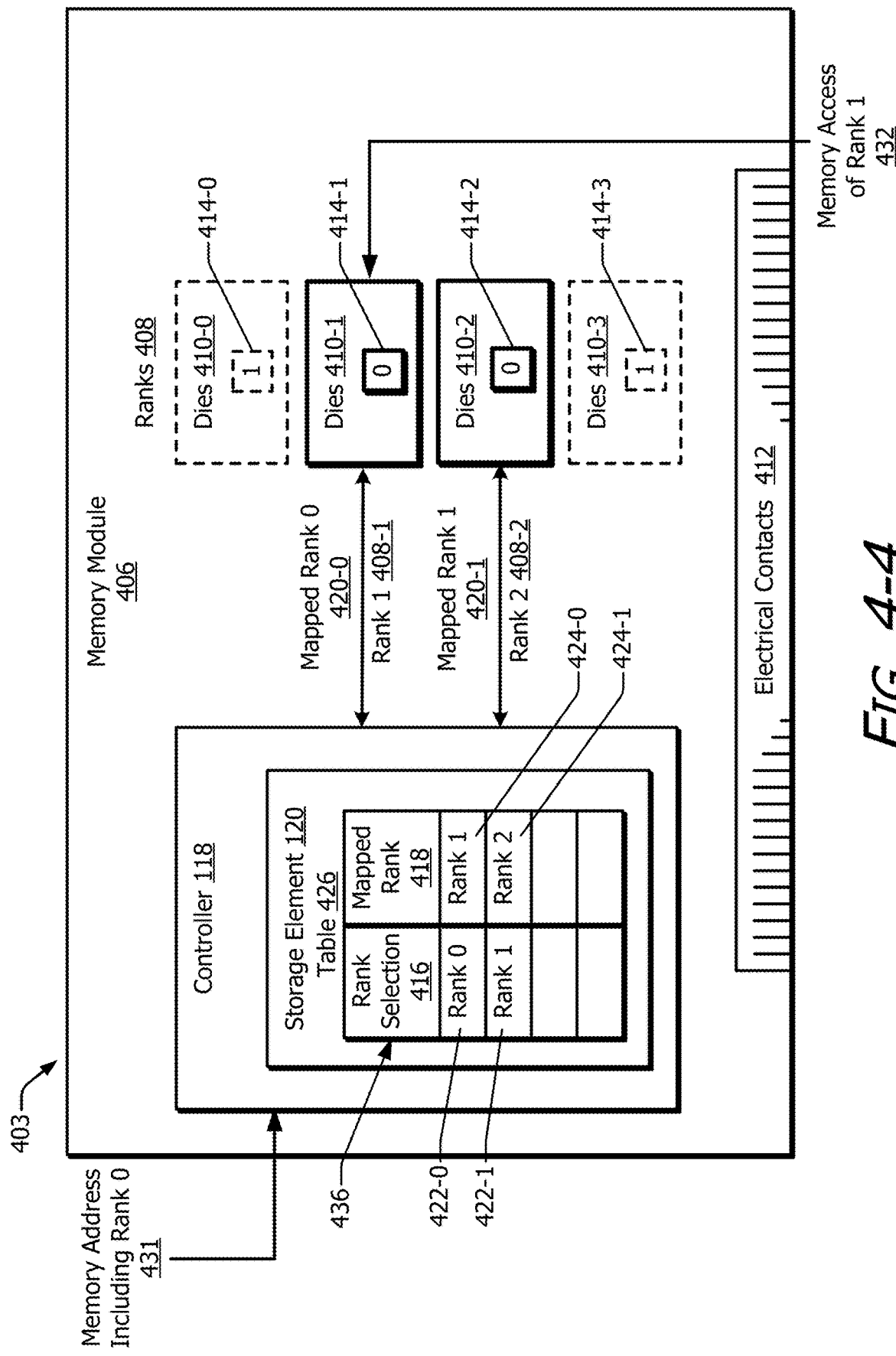
Figures 4, 5:
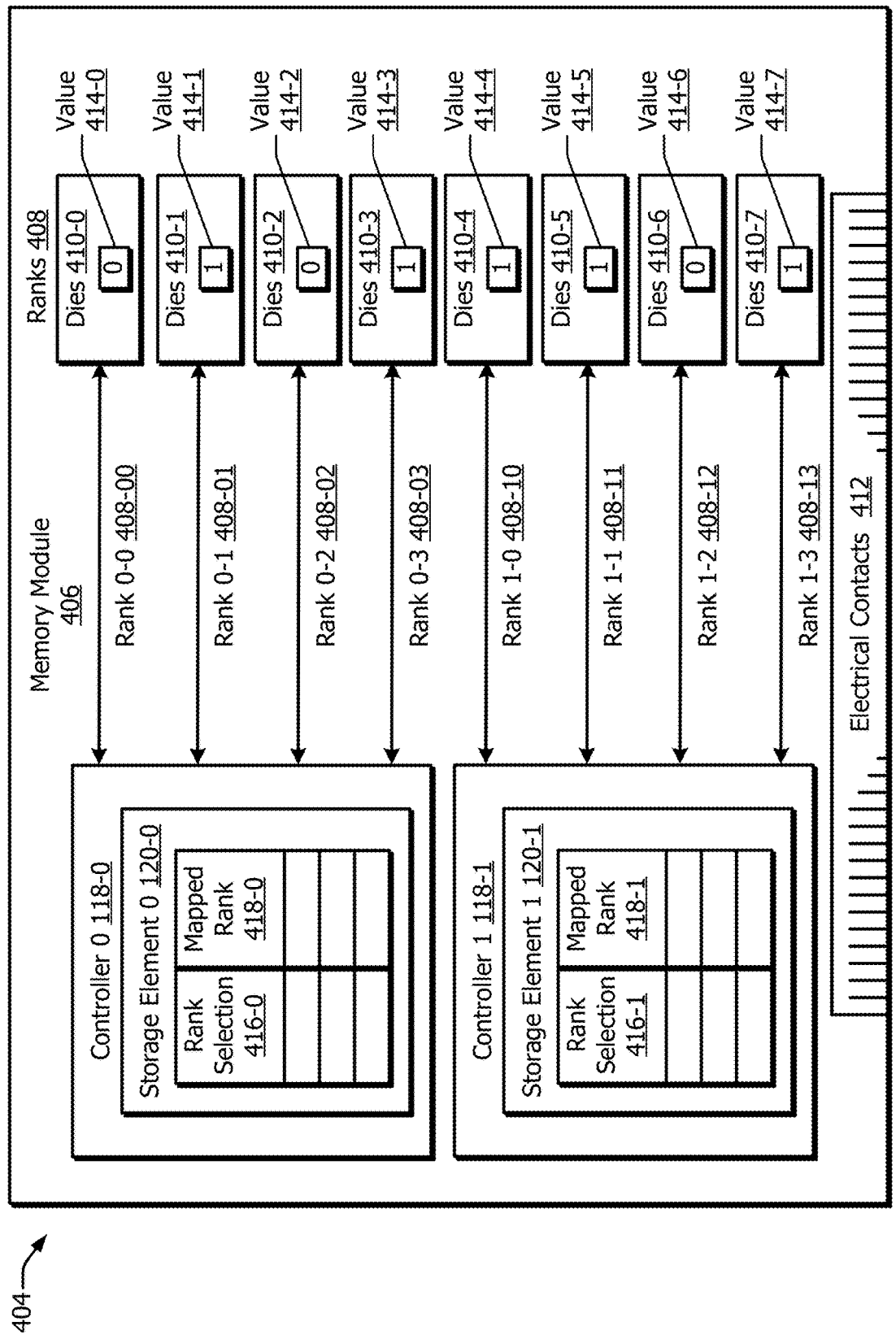
Figures 4, 5, 6:
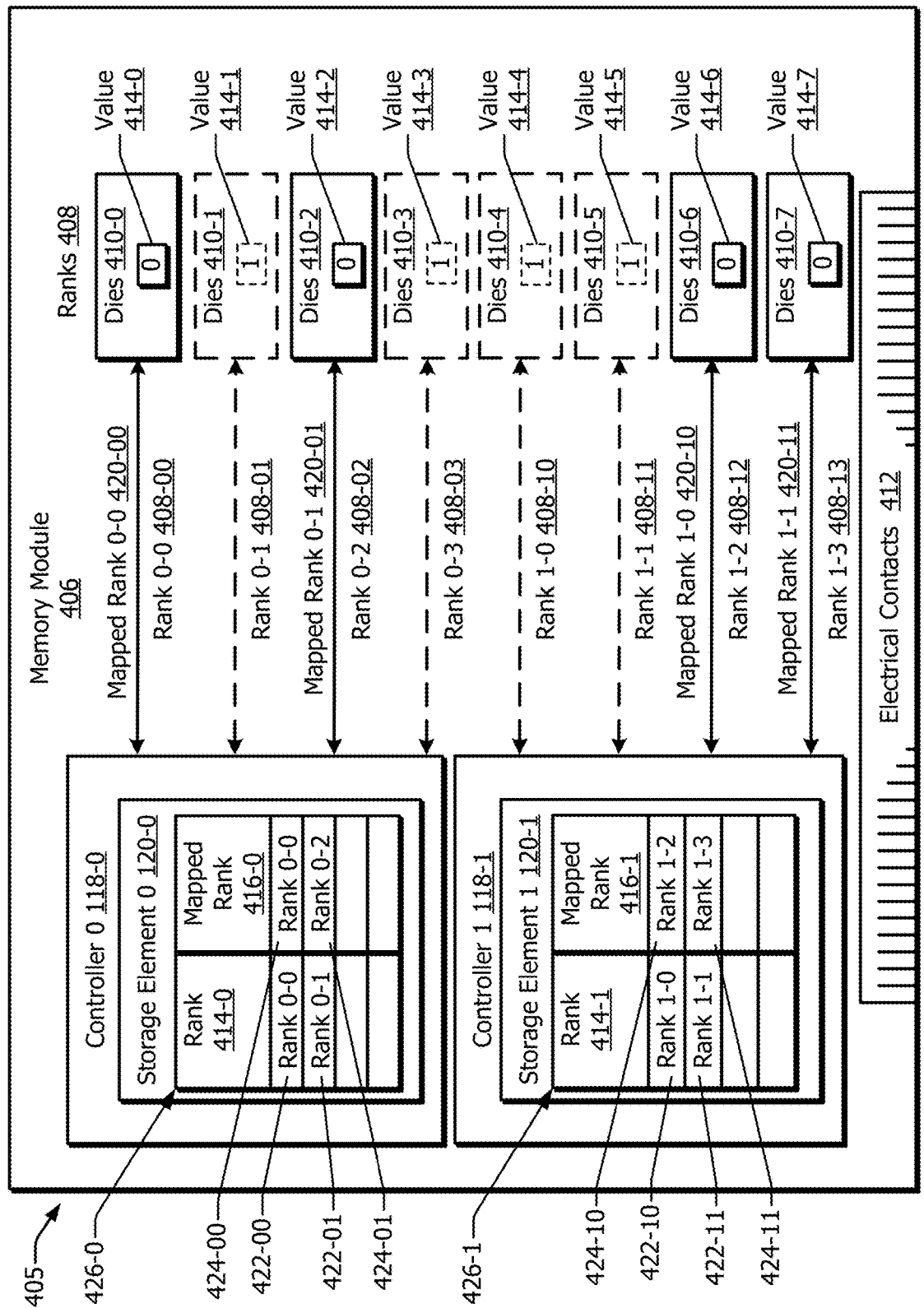
Figure 5:
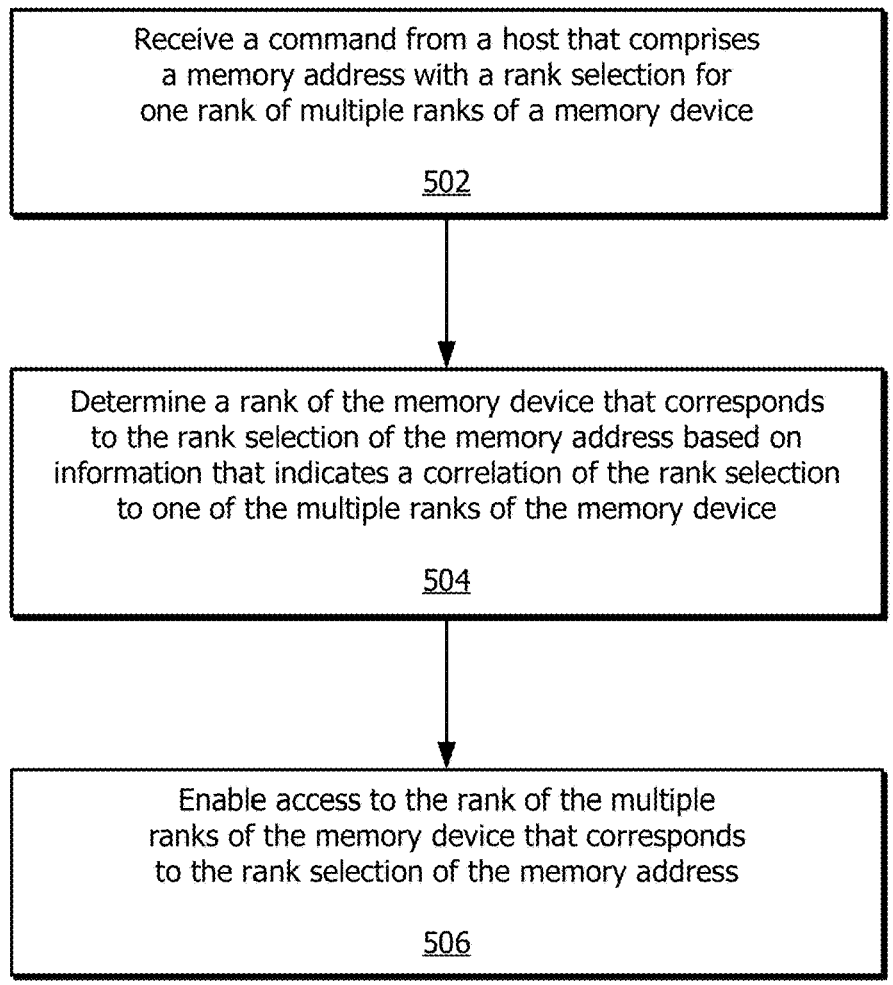
Figure 6:
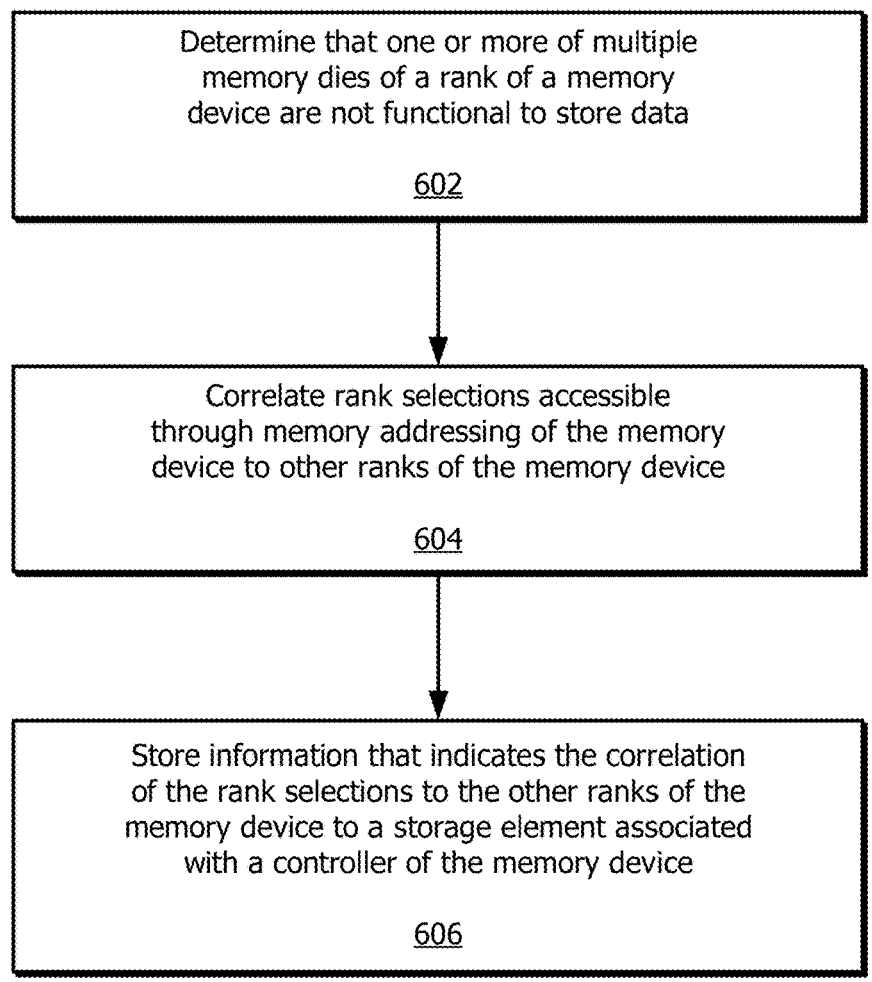

Generally, FIGS. 4-1 through 4-4 depict operations of a memory module 406 with a single memory controller 118 that implements die-based rank management with four ranks 408 (or sets) of memory dies 410-0 through 410-3 which are associated with respective ranks 408-0 through 408-3. FIGS. 4-5 and 4-6 depict operations of a memory module 406 with multiple memory controllers 118-0 and 118-1 that implement die-based rank management in accordance with one or more aspects. The controller 118-0 is in communication with the four sets of memory dies 410-0 through 410-3 associated with the respective ranks 408-0 through 408-3. The controller 118-1 is in communication with four other sets of memory dies 410-4 through 410-7 associated with ranks 408-4 through 408-7. In aspects, the memory module 406 may include electrical contacts 412 (e.g., contacts, pins, fingers, copper balls, ball grid array, solder bumps, etc.) through which the memory module 406 may be coupled and/or communicate with a host device, as previously described.

For the sake of simplicity of description, the sets of memory dies 410-0 through 410-7 will be referred to as "dies" 410-0 through 410-7, although it will be appreciated that a rank may include any suitable number of memory dies, such as one memory die or multiple dies. For example, a memory controller may activate or select multiple dies by asserting a CS input on each of the dies. In some cases, multiple dies selected or activated in response to receiving a common activation signal may constitute a rank. Generally, the dies of a rank may be coupled to a same address bus and a same data bus as respective dies of other ranks, but the selection of a particular rank via the CS inputs of the dies selects or activates a particular rank of dies from among other ranks of other dies. Accordingly, as described below, redirecting a rank selection from a rank of one or more unusable dies to another rank with functional or usable dies may include redirecting or remapping a CS signal (e.g., a common CS signal to dies of the rank) or similar signal to select a particular, usable rank to which the rank selection is mapped.

It will be appreciated that the numbers of the controllers 118 and dies 410 are used merely for illustration and that implementations of die-based rank management may be used with any number of controllers, any number of ranks, and any number of dies. In the examples and for purposes of illustration, a status, functionality, or usability of the die 410 is indicated by a value 414 that indicates whether the die 410 is usable or functional to store data. For example, a high value or "1" is used to indicate that the dies 410 of the rank 408 include one or more unusable dies, and a low value or "0" is used to indicate that the dies of the rank are usable or functional to store data. The values 414 may be maintained in a nonvolatile circuit, as previously described, to indicate or signal to or notify entities implementing die-based rank management to avoid or preclude enabling access to unusable dies. Alternatively or additionally, a controller of the memory module or memory device may disable or power down (e.g., set CS line to inactive logic state) unusable or nonfunctional memory dies, which may reduce power consumption of the device or module.

In FIG. 4-1, the controller 118 at 400 is operably coupled with and able to access the dies 410-0 through 410-3, which may be associated with or mapped to (e.g., by default or direct mapping) the ranks 408-0 through 408-3, respectively. In aspects, the controller 118 may determine or receive an indication that a die of the dies 410 that form one of the ranks 408 is not usable or functional to store data. For example, the functionality or usability of the dies 410-0 through 410-3 may be evaluated or determined during fabrication, package assembly, production testing, or a field test, following a power-up, after a reset, or so on. Based on the evaluation or testing, the controller 118 or another entity may set the value 414 for a rank or set of dies 410 to reflect or indicate whether the rank includes one or more dies that are not functional or usable to store data.

In the context of the present example, the controller 118 evaluates the dies 410 of the ranks 408, determines that at least one of the dies 410-0 is not usable or functional to store data reliably, and sets the value 414-0 corresponding to the dies 410-0 to a "1" state to indicate those dies are not usable. Alternatively or additionally, the controller 118 may set the value 414 for the group of dies 410 in response to detection of faults or metrics (e.g., bit-error rate, read errors, write errors, etc.) that exceed a threshold configured to monitor memory die functionality. Returning to the example at hand, rank 0 408-0 including the dies 410-0 is set or flagged as unusable, and the controller 118 may correlate or map the rank selections of the memory module 406 to avoid the unusable rank 408-0. Here, assume that the other dies 410-1, 410-2, and 410-3 are determined to be functional to store data and are thus marked with "0" states with respect to the value 414 to indicate valid or functional ranks of memory dies. In other words, the respective low values 414-1, 414-2, and 414-3 indicate that the dies 410-1, 410-2, and 410-3 are usable or functional to store data of the memory module 406. In accordance with aspects of die-based rank management, the controller 118 can correlate or map rank selections available through memory addressing of the system or memory module to ranks of the usable memory dies 410. The controller 118 may then store information indicating the mapping of rank selections to physical ranks in the storage element 120. In aspects, the storage element includes a data structure configured as a table with entries for rank selection 416 and corresponding entries of mapped ranks 418. Thus, implementations of die-based rank management may redirect a rank selection of rank 0 408-0 to another rank that includes usable dies, such as one of the ranks 408-1 through 408-3 that includes a usable set of dies 410-1, 410-2, or 410-3, respectively.

FIG. 4-2 illustrates generally at 401 an example of mapping of rank selections to memory module ranks based on evaluation of memory ranks or dies, such as the mapping described with reference to the entities of FIG. 4-1. As shown in FIG. 4-2, the controller 118 can redirect a rank selection (e.g., a direct or default mapping) from a rank that includes an unusable die to another rank of usable or functional dies based on the value 414-0 that indicates the die 410-0 is unusable (represented in dashed lines). In this example, the controller 118 correlates or remaps a rank selection 0 from rank 0 408-0 to rank 3 408-3 as shown in the rank selection column 416 and the mapped rank column 418 in the information maintained by the storage element 120. Alternatively, the controller 118 may redirect the rank selection of rank 0 408-0 to one of rank 1 408-1 or rank 2 408-2 and remap a direct rank selection of those ranks to rank 3 408-3 or another rank of functional memory dies.

As shown in FIG. 4-1 and/or FIG. 4-2, a rank selection may be redirected to other usable ranks of memory dies at an end of a sequence of ranks, which may be unassigned, available, or remapped from a previously assigned rank selection. Thus, in some cases, the controller 118 may redirect a rank selection of a lower rank (e.g., rank 0 selection) from an unusable rank to another rank of memory dies (e.g., rank 4) with a preexisting mapping to a higher rank selection (e.g., rank 4 selection), which may result in de-mapping, disabling, or un-associating the higher rank selection from a rank of memory dies. Accordingly, in some implementations, the controller 118 may remap and configure a memory device with a set of ranks (e.g., eight ranks, ranks 0-7) that includes one or two ranks with an unusable memory die as an operational memory device with a subset of functional ranks and corresponding rank selections (e.g., six ranks with rank 0, ranks 2-4, rank 6, and rank 7 mapped to rank selections 0-5).

In aspects, the controller 118 or another entity may implement the correlation or mapping of rank selections to ranks of usable or functional memory dies of the memory module. For example, the controller 118 or another device may generate, populate, and/or write the data structure or entries of the data structure described with reference to FIGS. 4-1 through 4-6. In some cases, the data structure (e.g., table 426) is created or populated by the controller 118 or another entity (e.g., test and/or programming equipment) during fabrication, production, assembly, or production testing of the memory module 406. Alternatively or additionally, the controller 118 or a memory controller of a host may generate or alter the data structure on the basis of or in response to a determination that a memory die is unusable or nonfunctional in post-production scenarios, such as in relation to a reset event, power-up event, power-on self-test, or memory test of the host or memory module 406.

Returning to the present example of FIG. 4-2, at least one of the dies 410-0 is not usable or functional to store data, and the controller 118 deselects or disables rank 0 408-0, as indicated by dashed lines representing rank 0 408-0. In redirecting a rank selection 0 of rank 0 408-0 (e.g., default or direct mapping), the controller 118 remaps the rank selection 0 to rank 3 408-3 as mapped rank 420-0. With reference to the rank selection column 416 and mapped rank column 418 of the storage element 120, this process is shown as the controller 118 populating, at 422-0, the rank selection 0 in the column 416 and populating, at 424-0, rank 3 408-3 of the dies 410-3 in the column 418. For the dies 410-1 and 410-2, which include usable or functional dies, the controller 118 may not act or abstain from actively directing rank selection to rank mappings to allow a passive mapping mechanism (e.g., direct mapping or default mapping by a memory controller or control logic) to associate these rank selections with the corresponding ranks. In other words, the controller 118 may not need to redirect rank selections of rank 1 408-1 and rank 2 408-2, as was performed for mapping the rank selection 0 to rank 3 408-3.

Accordingly, in this example and others described herein, control logic of the memory module 406 associates mapped rank 1 420-1 with or as rank 408-1 and associates mapped rank 420-2 with or as rank 408-2 with no redirection necessary. With reference to the rank selection column 416 and mapped rank column 418 of the storage element 120, this process is shown as the control logic populating a rank selection 1 and a rank selection 2 at 422-1 and 422-2, respectively, in the column 416 and populating rank 1 408-1 of the dies 410-1 and rank 2 408-2 of the dies 410-2 at 424-1 and 424-2, respectively, in the column 418. Alternatively, the controller 118 may associate these rank selections with the corresponding ranks of functional or usable memory dies, such as by implementing a default mapping or direct mapping scheme for ranks of functional or usable memory dies.

As described herein, redirection by the controller 118 of rank selection from unusable to usable ranks can be facilitated using information maintained by the storage element 120 operably coupled with the controller 118. In aspects, the storage element 120 may be incorporated within the controller 118 or may be embodied as a storage device separate from the controller 118. Generally, the storage element 120 stores information or a data structure that describes the correlation or mapping, such as in the form of a table 426, that correlates or maps a rank selection 416 available through or exposed by addresses of a memory system to a physical rank or mapped rank 420 formed from usable or functional memory dies. Thus, for rank 0 408-0 of the dies 410-0 that include at least one unusable or nonfunctional die, the storage element 120 receives and maintains information regarding where rank selection 0 422-0 is redirected, such as when requested through an address of a memory command. For rank selections that map directly to ranks of functional or usable dies, such as rank 1 422-1 and rank 2 422-2, the storage element 120 may indicate direction or mapping to those corresponding ranks without redirection.

In aspects, the controller 118 or storage element 120 enables access to the remapped or redirected ranks to enable memory operations and execution of memory commands. For example, memory access operations for data located at a particular rank selection may be routed or redirected based on the information stored or maintained by the storage element 120. In the context of the present example, the table 426 of the storage element 120 includes the rank selection 0 entry 422-0 under rank 416 that is associated or correlated as mapped rank 0 420-0 with rank 3 408-3 in the table as rank 3 at 424-0. Thus, when access to the rank selection 0 422-0 is requested, memory access is redirected on the basis of the contents of the storage element 120 to physical rank 3 408-3 of the functional memory dies 410-3. Therefore, when the memory module 406 receives or is presented with a memory address 428 that includes a rank selection for rank 0 422-0 of the memory module 406, the controller 118 or other address logic of the memory module directs the memory access for rank 0 to rank 3 408-3 at 430, as shown in FIG. 4-2.

For other rank table entries, such as for directly mapped rank selections and ranks of memory dies, the controller 118 or logic of the memory module 406 may forgo any redirection of rank selection to other ranks of the memory module. Thus, for a directly mapped rank selection 1 422-1 and a rank selection 2 422-2, the controller 118 or the address logic does not redirect the rank selection of received memory commands and allows memory operations to access rank 1 408-1 or rank 2 408-2, respectively, to execute memory commands normally. For example, the storage element 120 also includes rank selection entries 422-1 for rank 1 408-1 and 422-2 for rank 2 408-2, which correlate to entries 424-1 and 424-2 for mapped ranks 420-1 and 420-2, respectively. Accordingly, these rank selections are mapped to corresponding ranks of functional memory dies of the memory module 406 and are not redirected when executing memory commands or implementing memory access operations for rank 1 408-1 and rank 2 408-2.

In aspects of die-based rank management, the storage element 120, table 426, or other data structure accessible by the controller 118 enables rank selection to rank mapping and/or redirection of memory access commands or memory operations to remapped ranks of functional memory dies (e.g., mapped rank selection 0 to memory dies of rank 3). In some cases, the controller 118 or address logic of the memory module 406 enables redirection based on the information of the storage element 120 without notification or interaction of a host device or initiator of memory commands. In other words, the controller 118 or address logic of the memory module 406 may implement aspects of die-based rank management in a transparent fashion, such that additional configuration or modification of the host or initiator is not necessary. Therefore, the memory modules 406 described herein may respond to a memory access command, instruction, or operation by redirecting a rank selection associated (e.g., directly or by default) with a rank including an unusable or nonfunctional memory die to another rank of functional memory dies to complete the command, instruction, or operation. Because one or more ranks of the memory module that include an unusable memory die may be unmapped or disabled, the memory module may operate at less than a full capacity of physically populated memory dies (e.g., both functional and nonfunctional dies). Nonetheless, even if the memory module 406 includes a rank with an unusable die, aspects of die-based rank management enable use of other ranks of the memory module and preclude the need to discard or otherwise scrap the memory module due to the presence of one or more faulty memory dies.

As another example, consider the memory module 406 of FIG. 4-3, in which components may be configured and/or implemented that are similar to or different from those as described with reference to FIGS. 4-1, 4-2, 4-5, and 4-6. In the context of FIG. 4-3, assume that subsequent a power-up or reset event of a host device to which the memory module 406 is coupled, the controller 118 determines that two ranks of the memory module 406 include at least one memory die that is no longer usable or functional to store data of the host. Specifically, the controller determines that the dies 410-0 of rank 0 408-0 and the dies 410-3 of rank 3 408-3 include at least one unusable or nonfunctional memory die, rendering these ranks unsuitable for reliably storing data of the host device. Accordingly, the controller 118 may set corresponding functional indicator values 414-0 and 414-3, respectively, to "1," as shown in FIG. 4-3, thereby identifying or setting a status of these ranks of memory dies as unusable to store data. On the basis of determining that rank 0 408-0 and rank 3 408-3 include unusable dies, the controller 118 can update a table 426 or another data structure maintained in the storage element 120 to identify these unusable ranks and/or implement a remapping of the corresponding rank selections to other ranks of the memory module 406.

Continuing this example at 403 in FIG. 4-4, the controller 118 generates or configures a table 426 or another data structure to redirect rank selections to the dies 410-0 and 410-3 in accordance with one or more aspects. In the example of FIG. 4-2, the controller 118 configured the table 426 to redirect a rank selection from a rank of unusable dies to another rank (e.g., a next available rank) at an end of a sequence of functional ranks of the memory module. As shown in FIG. 4-4, however, the controller 118 may be configured to populate or generate a rank selection to the rank mapping table 426 according to other rules or schema, such as by correlating a rank selection to a next rank of usable or functional dies. Thus, with rank 0 408-0 being unusable or nonfunctional, as indicated by a value 414-0 being "1," the controller 118 redirects a rank selection 0 422-0 to rank 1 408-1 as mapped rank 0 420-0. With rank 1 408-1 mapped, the controller 118 then maps a rank selection 1 422-1 to a next functional rank of rank 2 408-2 as mapped rank 1 420-1, as shown in FIG. 4-4. Because the other dies 410-1 and 410-3 are unusable, the controller 118 may omit these dies or ranks from the table 426 of mappings of rank selections to physical ranks. Additionally, the memory module 406 may provide an alert or indication to the host device reflecting a reduced capacity based on the remapping of the rank selections (e.g., previously four directly mapped ranks) to the reduced rank selection set of two ranks of functional memory dies. In accordance with aspects described herein, the controller 118 or address logic of the memory module 406 may then redirect or route memory commands, instructions, or operations for the rank selection 0 422-0 or the rank selection 1 422-1 to rank 1 408-1 or rank 2 408-2, respectively, as mapped ranks 420 as shown in FIG. 4-4. For example, when a memory command 431 with an address for rank 0 is received by the memory module 406, the controller 118 may redirect, on the basis of the information of the table 426, the memory command to rank 1 408-1 of the memory dies 410-1 as shown at 432.

As yet another example, consider the system 404 of FIG. 4-5, in which the memory module 406 includes the separate controllers 118-0 and 118-1, each of which includes or is associated with a respective storage element 120-0 and 120-1. Here, each of the controllers 118-0 and 118-1 may also be associated with a respective group of up to four ranks formed from sets of memory dies. Although described in the context of four ranks, aspects of die-based rank management may be implemented with any suitable number of ranks and/or dies from which the ranks are formed. In this example, a controller 0 118-0 is operably coupled with rank 0-0 408-00 through rank 0-3 408-03, which include or are formed from sets of dies 410-00 through 410-03, respectively. Similarly, a controller 1 118-1 is operably coupled with rank 1-0 408-10 through rank 1-3 408-13, which include or are formed from sets of dies 410-4 through 410-7, respectively.

As previously described, respective status values 414-0 through 414-7 may indicate whether each of the sets or groups of the dies 410-0 through 410-7 include at least one die that is not usable or functional (e.g., unable to store host data reliably). In some cases, a high value or "1" associated with a set of the dies indicates that the set of dies includes at least one unusable die, although any suitable logical or bit schema may be implemented to identify or distinguish unusable dies. Here, assume that the controllers 118-0 and 118-1 or production test equipment have set the values 414-1, 414-3, 414-4, and 414-5 to high values ("1") in response to testing results (e.g., write/readback tests) that indicate the respective sets of the dies 410-1, 410-3, 410-4, and 410-5 include at least one die that is unusable. In accordance with aspects of die-based rank management, the controllers 118-0 and 118-1 may redirect rank selections away from these ranks to other ranks of the memory module 406 of functional dies.

Continuing the present example at 405 in FIG. 4-6, the controllers 118 implement die-based rank management to map or correlate rank selections of the memory module 406 to ranks of functional memory dies. In aspects, the controller 118-0 may forgo the remapping of rank selections that correspond, such as by direct or default mapping, to ranks of usable or functional memory dies. As such, the controller 118-0 does not remap or redirect a rank selection 0-0 422-00, which maps directly to rank 0-0 408-00 as mapped rank 0 420-00, as indicated in a table 426-0 of a storage element 0 120-0. When encountering a rank selection 0-1 422-01, which correlates directly or by default to rank 0-1 408-1 of the unusable or nonfunctional dies 410-1 (as indicated by dashed lines), the controller 118-0 remaps this rank selection to another rank of functional memory dies. In this example, the controller 118-0 populates the table 426-0 to reflect the remapping of the rank selection 0-1 422-01 to rank 0-2 408-02 as mapped rank 420-01. Here, note that with rank 0-3 408-03 also including an unusable or nonfunctional die (as indicated by dashed lines), the controller 118 does not further populate the table 426-0 with additional mappings of rank selections to ranks. On the basis of the information maintained by the storage element 0 120-0, the controller 0 118-0 may report or update a memory capacity to a host device or an upstream controller (neither of which is shown in FIG. 4-6) to reflect the number of ranks and/or sets of usable dies (e.g., of the dies 410-1 through 410-3) that are accessible in relation to the controller 118-0.

Similarly, the second controller 1 118-1 of the memory module 406 may implement die-based management to remap or redirect rank selections for a second group of ranks of the memory module formed from the dies 410-4 through 410-7. As shown in FIG. 4-6, the respective dies 410 of rank 1-0 408-10 and rank 1-1 408-11 include at least one die that is not usable or functional to store data (as indicated by dashed lines) and are thus excluded by the controller 118-1 from the mappings of rank selections to ranks. Accordingly, the controller 118-1 redirects a rank selection 1-0 422-10 and rank selection 1-1 422-11 to the next or other available ranks of usable and/or functional dies and populates a table 426-1 to reflect these mappings. In this example, the controller 118-1 maps the rank selection 1-0 422-10 to rank 1-2 408-12 as mapped rank 1-0 420-10 and maps the rank selection 1-1 422-11 to rank 1-3 408-13 as mapped rank 1-1 420-11. The controller 118-1 enters these mappings into the table 426-1 of a storage element 120-1 to indicate or reflect the mappings of rank selections to ranks, such that memory commands, instructions, or operations can be redirected to the active rank to which a rank selection is remapped. As described herein, the controller 118-1 may also update or report a capacity of or portion of the memory module to the host device or higher-level memory controller (not shown) on the basis of the information maintained by the storage element 120-1.

As described with reference to FIGS. 2-1 and 2-2 and FIGS. 3-1 through 3-3, die-based rank management may be implemented in controllers or control logic at various points or levels in a memory system hierarchy. In the context of FIGS. 4-1 through 4-6, die-based rank management is described with reference to controllers of a memory module, which may communicate with other memory controllers or entities described with reference to FIGS. 1 through 3-3 to implement die-based rank management. Alternatively or additionally, aspects of die-based rank management may be implemented in a physical control logic associated with dies or in other control devices disposed between a processor of a host device and ranks of memory dies. As such, the examples of die-based rank management in the controllers described with reference to FIGS. 4-1 through 4-6 are presented by way of illustration and not by way of limitation.

Generally, aspects of die-based rank management enable flexible management and use of functional ranks and/or memory dies of a memory device even when other dies are not usable or functional to store data. By maintaining a mapping or correlation of rank selections to functional ranks, a controller, logic, or other control device associated with a memory device or module can redirect memory access rank selections to ranks of usable and/or functional dies while avoiding dies that are unusable. In aspects, this remapping and redirecting may be performed transparently to a host device initiating an instruction, command, or operation to access a memory address. As a result, a memory device may be usable, in at least a partial capacity, without modification of a host device, memory operations, or software of an initiator.

Example Methods

Figure 7:
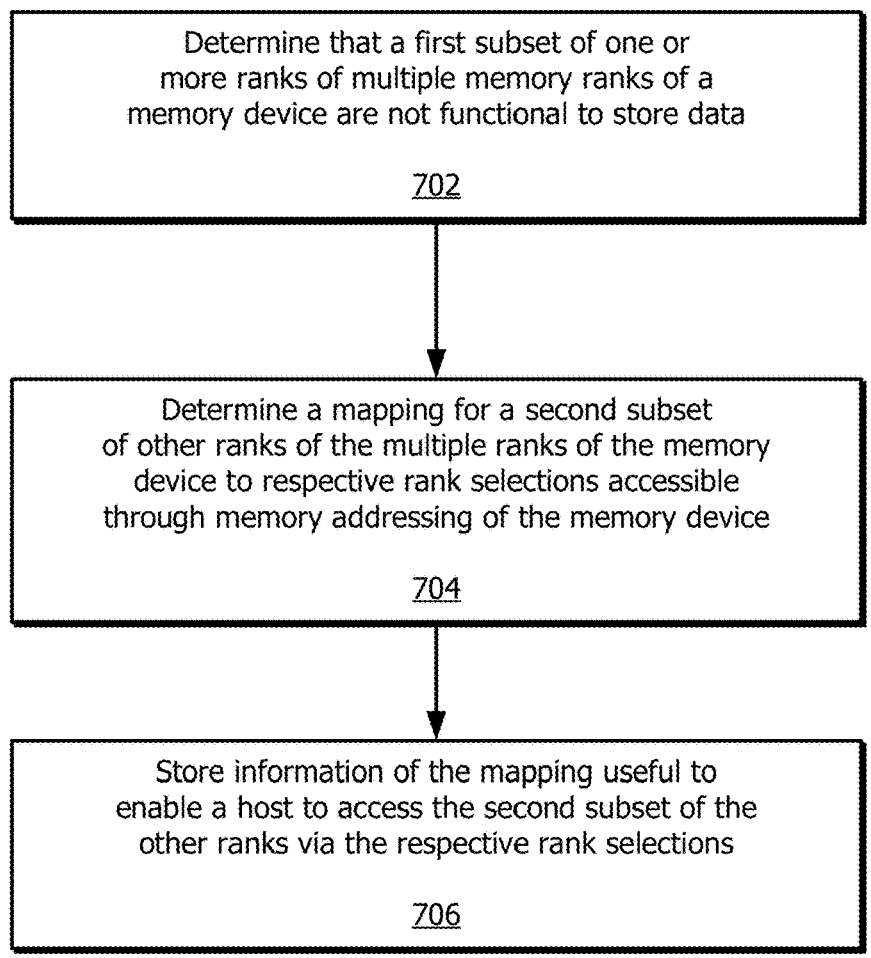
FIG. 7 illustrates another example method for die-based rank management in accordance with one or more aspects.

FIGS. 5 through 7 describe example methods 500 through 700 with reference to flow diagrams that illustrate aspects of die-based rank management in accordance with one or more aspects. The descriptions of the methods 500 through 700 may refer to components, entities, and other aspects depicted in FIG. 1 through FIG. 4-6, and reference to such is made by way of example only. In various implementations, operations of the following example methods can be at least partially performed by a die-based rank controller 118, a physical control logic, a memory controller, or another control device as described with reference to FIG. 1, FIGS. 2-1 and 2-2, FIGS. 3-1 through 3-3, or FIGS. 4-1 through 4-6. Thus, although the operations may be described generally as being performed by the controller 118, other entities of the memory system (e.g., control or address logic) or entities associated with the memory system (e.g., test equipment or module configuration and/or programming devices) may implement, in whole or part, the operation described. For the sake of example, the flow diagrams will be described with reference to FIGS. 4-1 through 4-6, although it will be appreciated that the same method may be utilized with any of the apparatuses or memory systems herein described.

FIG. 5 illustrates an example method 500 for enabling access to a rank of memory in accordance with one or more aspects of die-based rank management. In the context of the method 500, assume that a controller 118 has remapped at least one rank selection of a memory system to a rank of memory dies that does not directly correspond to the rank selection in accordance with aspects described herein. Thus, the memory of the system is organized into multiple ranks available via rank selections and at least some other memory of the system (e.g., unusable dies) is not organized into those multiple ranks.

At 502, a memory system receives a command from a host that comprises a memory address with a rank selection for one rank of multiple ranks of a memory device. The memory device includes at least one rank with an unusable or nonfunctional die, such that redirection of at least one rank selection is implemented to enable access to all functional ranks of the memory device. In the context of FIG. 4-4, the controller 118 or address logic of the memory module 406 receives a memory command that includes an address with a rank selection for rank 0. As described with reference to FIG. 4-4, the controller 118 or another entity remaps a rank selection 0 of the memory module to rank 1 of functional memory dies due to rank 0 including an unusable or nonfunctional die.

At 504, the controller determines a rank of the memory device that corresponds to the rank selection of the memory address based on information that indicates a correlation of the rank selection to one of the multiple ranks of the memory device. The controller may access information or a data structure of a storage element that indicates correlations or mappings of rank selections to ranks of memory dies of the memory system. Continuing the example of FIG. 4-4, the controller 118 accesses the table 426 of the storage element 120 to determine which rank of memory dies correlates to rank selection 0 422-0. Based on the information of the table 426, the controller 118 determines that rank 0 422-0 is mapped to rank 1 408-1 of the memory module as mapped rank 0 420-0.

At 506, the controller enables access to the rank of the multiple ranks of the memory device that corresponds to the rank selection of the memory address. In aspects, the controller or address logic may reroute or redirect the rank selection of the memory command to the mapped rank of memory dies. In some cases, the controller or address logic performs the redirection within the memory module, such that the redirection operation is transparent from the perspective of the host device or higher-level memory controllers. Concluding the present example described with reference to FIG. 4-4, the controller redirects the access command for rank 0 to the dies 410-1 of rank 1 as shown at 432. Based on this redirected access, the memory command may execute a read or write of the data within the dies 410-1 of rank 1 408-1 and return the results or an acknowledgment of command completion to the host.

FIG. 6 illustrates an example method 600 for die-based rank management in accordance with one or more aspects. Generally, a controller or other entity of a memory module may implement the method 600 to remap one or more rank selections from ranks with an unusable die to other ranks of functional dies.

At 602, the controller determines that one or more of multiple memory dies of a rank of a memory device are not functional to store data. The controller may identify the unusable or nonfunctional dies in response to a failure of a memory access operation, based on testing of the memory dies, or based on indicators set during production or post-production testing of the memory dies. For example, in the context of FIG. 4-1, the controller 118 (or test equipment) may evaluate the dies 410-0 through 410-3 after production of the memory module 406. In response to one or more of the memory dies 410-0 of rank 0 408-0 failing a memory performance test, the controller (or test equipment) sets the value 414-0 to "1," indicating that the dies 410-0 of rank 0 are not usable or functional to store data.

At 604, the controller correlates rank selections accessible through memory addressing of the memory device to other ranks of the memory device. The controller may correlate or map a rank selection to a next rank of functional memory dies or to a rank at an end of a rank sequence that is available for assignment. For example, in a four-rank memory module, the controller may map a rank selection to a fifth rank or spare rank populated in the memory module. In the context of the present example and FIG. 4-2, because rank 0 is nonfunctional and/or disabled, the controller 118 maps rank selection 0 422-0 to rank 3 408-3, which is located at an end of the rank sequence of the memory module 406. Without a spare rank of dies, the controller 118 may also report or indicate a reduced capacity, such as a 25% capacity reduction (1 of 4 dies) of the memory module 406, due to the loss of rank 0.

At 606, the controller stores information that indicates the correlation of the rank selections to the other ranks of the memory device to a storage element associated with a controller of the memory device. The controller may generate or populate any suitable data structure, such as a table or index that indicates a mapping of rank selections to physical rank within the memory system. By generating or populating this information, a controller or logic of the memory device may then enable access by redirecting memory commands, instructions, or operations based on the mappings of rank selections to ranks indicated by the data structure, such as described in reference to the method 500. Concluding the present example and with reference to FIG. 4-2, the controller populates the table 426 with mappings of rank selections 0 through 2 to rank 3, rank 1, and rank 2, respectively, of the memory module 406. With the mappings complete, the memory module 406 may operate with the rank selection 0 through the rank selection 2 exposed or available, while disabling a rank selection 3 (not shown) due to the unavailability of a fourth rank of functional dies.

FIG. 7 illustrates another example method 700 for die-based rank management in accordance with one or more aspects. In aspects, a controller of a memory device (or memory module) may implement operations of the method 700 to map one or more rank selections of the memory device to ranks of usable or functional memory dies.

At 702, the controller determines that a first subset of one or more ranks of multiple memory ranks of the memory device are not functional to store data. In some cases, the controller checks a respective indicator value associated with each of the multiple memory ranks to determine whether the memory dies of the ranks are usable. In other cases, the controller may test or evaluate the respective dies of the ranks to determine which ranks of the dies include an unusable die and therefore should be excluded from use. In the context of FIG. 4-5, assume that the controller 118-0 initiates a procedure of mapping rank selections to ranks by determining which of the ranks 408-0 through 408-3 may include an unusable die. Here, the controller tests each of the dies and determines that the dies 410-1 of rank 0-1 408-01 and the dies 410-3 of rank 0-3 408-03 include an unusable or nonfunctional die, setting the value indicating functionality of the dies 410-1 and 410-3 to "1". This process may preclude the inclusion of these ranks in the mapping of functional ranks to rank selections of the memory module 406.

At 704, the controller determines a mapping for a second subset of other ranks of the multiple ranks of the memory device to respective rank selections accessible through memory addressing of the memory device. The second subset of the other ranks may include ranks of functional dies of the memory module. In some cases, the controller proceeds through a sequence of rank selections available for the memory module and maps the rank selections to respective ones of the ranks of functional dies. In the context of the present example and with reference to FIG. 4-6, the controller maps the rank selection 0-0 422-0 to rank 0-0 408-00 as mapped rank 00 420-00 and maps rank selection 422 0-1 to rank 0-2 408-02 as mapped rank 0-1 420-01.

At 706, the controller stores information of the mapping useful to enable a host to access the second subset of the other ranks via the respective rank selections. As described herein, the information stored by the storage element that indicates the mapping or correlation of rank selections with ranks as mapped ranks may enable memory commands, instructions, or operations to access a remapped rank of functional dies. Concluding the present example, the controller 118 writes the information on mapping of rank selections to ranks to the table 426-0 of the storage element 120-0 for the first controller 118-0 of the memory module 406. For multi-rank and/or multi-controller-enabled memory modules, the operations of the method 700 may be repeated to implement die-based rank management for additional controllers and/or additional ranks of memory dies.

For the example flow diagrams and methods described above, the orders in which operations are shown and/or described are not intended to be construed as a limitation. Any number or combination of the described operations can be combined or rearranged in any order to implement a given or an alternative method. Operations may also be omitted from or added to the described methods. Further, the described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components described herein, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although this document describes implementations of die-based rank management for memory systems in language specific to certain features or methods, the subject of the appended claims is not limited to the described features or methods. Instead, this document discloses the described features and methods as example implementations of die-based rank management for memory systems.

What is claimed is:

1. An apparatus comprising:
    a memory device comprising:
        a link controller configured to receive a memory request from a host;
        a memory controller configured to receive, via an interconnect, the memory request from the link controller and generate, based on the memory request, a memory command;
        memory organized into multiple ranks;
        physical control logic coupling the memory controller to the memory organized into the multiple ranks; and
        rank mapping logic implemented by the memory controller and coupled with a storage element, the rank mapping logic configured to:
            determine that a memory die of one of the multiple ranks is not functional to store data;
            determine information that indicates correlations of rank selections of memory addresses to ranks of the multiple ranks of the memory device by remapping a rank selection from the rank that includes the memory die that is not functional to another rank of the multiple ranks;
            store, to the storage element of the memory controller, the information that indicates the correlations of the rank selections of the memory addresses to the ranks of the multiple ranks of the memory device;
            determine that a rank selection of an address of the memory command provided by the memory controller corresponds to the rank selection that is remapped from the rank that includes the memory die that is not functional to the other rank of the multiple ranks; and
            cause, based on the information, the memory controller to redirect the memory command from the rank that includes the memory die that is not functional to the other rank of the multiple ranks to enable access to the memory device.

2. The apparatus of claim 1, wherein the rank mapping logic of the memory controller is further configured to determine the rank of the multiple ranks that corresponds to the rank selection based on the information.

3. The apparatus of claim 1, wherein the information of the storage element comprises a table that indicates correlations of rank selections available through memory addresses to respective ones of the multiple ranks of the memory device, including the correlation of the rank selection of the memory address of the received memory command to the rank of the multiple ranks of the memory device.

4. The apparatus of claim 1, wherein:
    the memory of the memory device comprises multiple memory dies that are organized into the multiple ranks.

5. The apparatus of claim 1, wherein the rank mapping logic of the memory controller is further configured to determine that the memory die of the memory device is not functional to store data during fabrication, production, or testing of the memory device.

6. The apparatus of claim 1, wherein the rank mapping logic of the memory controller is further configured to:
    determine the correlations of the rank selections of the memory addresses to the ranks of the multiple ranks of the memory device during fabrication, production, or testing of the memory device; or
    store the information indicating correlations of the rank selections of the memory addresses to the ranks of the multiple ranks of the memory device to the storage element during the fabrication, the production, or the testing of the memory device.

7. The apparatus of claim 1, further comprising a fuse circuit operably coupled with the rank mapping logic and configured to maintain state information indicating that the memory die of the memory device is not functional to store data.

8. The apparatus of claim 1, wherein the rank mapping logic of the memory controller is further configured to disable the memory die of the memory device that is not functional to store data.

9. The apparatus of claim 1, wherein the rank mapping logic of the memory controller is further configured to determine that the memory die of the memory device is not functional to store data following a power-up or reset of the memory device.

10. The apparatus of claim 1, wherein the rank mapping logic of the memory controller is further configured to:
determine the correlations of the rank selections of the memory addresses to the ranks of the multiple ranks of the memory device following power-up or reset of the memory device; or
store the information indicating the correlations of the rank selections of the memory addresses to the ranks of the multiple ranks of the memory device to the storage element following the power-up or reset of the memory device.

11. The apparatus of claim 1, wherein:
the rank mapping logic of the memory controller is further configured to determine the correlations of the rank selections of the memory addresses to the ranks of the multiple ranks of the memory device; and
the ranks of the multiple ranks comprise available ranks that memory dies of the memory device that are functional.

12. The apparatus of claim 1, wherein the storage element configured to store the information comprises a nonvolatile memory circuit.

13. The apparatus of claim 12, wherein the rank mapping logic of the memory controller comprises the nonvolatile memory circuit.

14. The apparatus of claim 1, wherein the memory controller comprises:
the rank mapping logic and the storage element that stores the information that indicates the correlations of the rank selections of the memory addresses to the ranks of the multiple ranks of the memory device.

15. The apparatus of claim 1, wherein the memory device comprises a center controller that is communicatively coupled with the link controller and the memory controller of the memory device.

16. The apparatus of claim 1, wherein:
the memory device comprises multiple memory controllers that include respective instances of the rank mapping logic; and
each of the multiple memory controllers is configured to access a respective subset of the memory dies of the memory and includes a respective storage element configured to store information that correlates the rank selections of the memory addresses with ranks comprising one or more memory dies of the respective subset of the memory dies.

17. The apparatus of claim 1, wherein the apparatus comprises a multiple die package (MDP) that comprises the memory and the memory controller with the rank mapping logic.

18. An apparatus comprising:
a memory device including:
memory dies organized into multiple ranks;
a memory controller configured to receive, via an interconnect and from a host, a memory request and generate, based on the memory request, a memory command; and
rank mapping logic implemented by the memory controller and coupled with a storage element, the rank mapping logic configured to:
determine that a memory die of one of the ranks of the multiple ranks is not functional to store data;
determine information that indicates a mapping of memory address rank selections to respective ranks of the multiple ranks by remapping a rank selection from the rank that includes the memory die that is not functional to another rank of the multiple ranks;
store, to the storage element of the memory controller, the information that indicates the mapping of the memory address rank selections to the respective ranks of the multiple ranks of the memory device;
determine that a rank selection of an address of the memory command provided by the memory controller corresponds to the rank selection that is remapped from the rank that includes the memory die that is not functional to the other rank of the multiple ranks; and
cause, based on the information indicative of the mapping, the memory controller to redirect the memory command from the rank that includes the memory die that is not functional to the other rank of the multiple ranks to enable access to the memory device.

19. The apparatus of claim 18, wherein the information indicative of the mapping that is stored by the storage element comprises a table that indicates the mapping of the memory address rank selections to the respective ranks of the multiple ranks to provide the mapped ranks of the memory device.

20. The apparatus of claim 18, wherein the rank selection logic of the memory controller is further configured to:
determine the mapping of the memory address rank selections to the respective ranks of the multiple ranks during fabrication, production, or testing of the memory device; or
store the mapping of the memory address rank selections to the respective ranks of the multiple ranks in the storage element during the fabrication, the production, or the testing of the memory device.

21. The apparatus of claim 18, wherein at least one of the memory dies that is not functional to store data is not organized into the multiple ranks of the memory device.

22. The apparatus of claim 18, wherein the rank mapping logic of the memory controller is further configured to determine that the memory die is not functional to store data during fabrication, production, or testing of the memory device.

23. The apparatus of claim 18, wherein the rank mapping logic of the memory controller is further configured to determine that the memory die is not functional to store data following a power-up or reset of the memory device.

24. The apparatus of claim 18, wherein the rank mapping logic of the memory controller is further configured to:
determine the mapping of the memory address rank selections to the respective ranks of the multiple ranks following a power-up or reset of the memory device; or
store the information indicating the mapping of the memory address rank selections to the respective ranks of the multiple ranks in the storage element following the power-up or reset of the memory device.

25. The apparatus of claim 18, wherein the rank mapping logic of the memory controller is further configured to:
determine the memory dies of the memory device that are functional to store data; and
form the respective ranks of the multiple ranks from the memory dies that are determined to be functional to store data.

26. The apparatus of claim 18, wherein:
the memory device comprises multiple memory controllers that include respective instances of the rank mapping logic; and
each of the multiple memory controllers is configured to access a respective subset of the memory dies of the memory device and comprises a respective storage element storing a mapping of the memory address rank selections to a respective set of ranks accessible by each of the multiple memory controllers.

27. The apparatus of claim 18, wherein the memory device comprises a multiple die package (MDP) comprising the memory dies and the memory controller with the rank mapping logic.

28. An apparatus comprising:
a storage element configured to store a mapping of rank selections of memory addresses to corresponding ranks of multiple ranks of a memory device as mapped ranks;
a memory controller configured to receive, from a host, a memory request and generate, based on the memory request, a memory command;
an interface operably coupled to an interconnect through which the multiple ranks of the memory device are accessible; and
rank mapping logic implemented by the memory controller and coupled with the storage element and the interface, the rank mapping logic configured to:
determine, via the interface, that a memory die of one of the ranks of the multiple ranks of the memory device is not functional to store data;
generate the mapping of the rank selections of memory addresses to the corresponding ranks of the multiple ranks by remapping a rank selection from the rank that includes the memory die that is not functional to another rank of the multiple ranks;
store, to the storage element, the mapping of the rank selections of the memory addresses to the corresponding ranks of the multiple ranks of the memory device;
determine that a memory address rank selection of the memory command provided by the memory controller corresponds to the rank selection remapped from the rank that includes the memory die that is not functional to the other rank of the multiple ranks; and
cause, based on the mapping, the memory controller to redirect the memory command from the rank that includes the memory die that is not functional to the other rank of the multiple ranks to enable access to the memory device.

29. The apparatus of claim 28, wherein the mapping is stored in the storage element as a table of the mapped ranks that correspond to the rank selections of the memory addresses.

30. The apparatus of claim 28, wherein the memory device comprises multiple memory dies and the rank mapping logic of the memory controller is further configured to:
generate the mapping in response to determining that the memory die is not functional to store data, the memory die that is not functional to store data being excluded from the multiple ranks of the memory device.

31. The apparatus of claim 30, wherein the rank mapping logic of the memory controller is further configured to:
generate the mapping in association with testing, a power-up, or a reset of the memory device; or
store the mapping to the storage element following the testing, the power-up, or the reset of the memory device.

32. The apparatus of claim 28, wherein the rank mapping logic of the memory controller is further configured to:
determine that one or more of the multiple memory dies of the memory device are functional to store data; and
generate the multiple ranks of the mapping from the one or more of the multiple memory dies that are determined to be functional to store data.

33. The apparatus of claim 28, wherein the storage element comprises a nonvolatile memory circuit.

34. The apparatus of claim 28, wherein the storage element is embodied as part of the rank mapping logic of the memory controller of the apparatus.

35. The apparatus of claim 28, wherein:
the apparatus comprises multiple memory controllers that include respective instances of the rank mapping logic; and
each of the multiple memory controllers is configured to access a respective set of ranks of the memory device and comprises a respective storage element storing a mapping of the memory address rank selections to the respective set of ranks accessible by the controller.

36. A method comprising:
determining, by rank mapping logic of a memory controller operably coupled to multiple memory dies of a memory device organized into multiple ranks, that a memory die of one of the ranks of the multiple ranks is not functional to store data;
determining a mapping of rank selections of memory addresses to corresponding ranks of the multiple ranks by remapping a rank selection from the rank that includes the memory die that is not functional to another rank of the multiple ranks;
storing, to a storage element of the memory controller, the mapping of the rank selections of memory addresses to the corresponding ranks of the multiple ranks of the memory device;
receiving a memory command from a host that comprises a memory address with a rank selection for one rank of multiple ranks of the memory device;
determining, based on the mapping, that the rank selection of the memory command corresponds to the rank selection that is remapped from the rank that includes the memory die that is not functional to the other rank of the multiple ranks and
causing, based on the mapping, the memory controller to redirect the memory command from the rank that includes the memory die that is not functional to the other rank of the multiple ranks to enable access to the memory device.

37. The method of claim 36, wherein determining that the rank selection of the memory command corresponds to the rank selection that is remapped further comprises accessing the storage element that stores the mapping of the rank selections of the memory addresses to the corresponding ranks of the multiple ranks of the memory device.

38. The method of claim 36, wherein the memory device comprises a number of physical ranks that is greater than a number of the multiple ranks that are accessible through the rank selection of the memory address or other rank selections of other memory addresses.

39. The method of claim 36, wherein:
the mapping comprises a sequence of the multiple ranks that does not linearly correspond with a sequence of the rank selections.

40. A method comprising:
determining that one or more memory dies of a rank of a memory device are not functional to store data;

correlating rank selections accessible through memory addressing of the memory device to another rank of multiple ranks of the memory device by remapping a rank selection that includes the one or more memory dies that are not functional to another rank of the other ranks of the memory device;

storing information that indicates the correlation of the rank selections to the other ranks of the memory device to a storage element associated with a memory controller of the memory device;

receiving, by the memory controller, a memory command from a host that comprises a memory address with a rank selection for one rank of multiple ranks of the memory device;

determining, based on the information, that the rank selection of the memory command corresponds to the rank selection that is remapped from the rank that includes the one or more memory dies that are not functional to the other rank of the multiple ranks; and redirecting, by the memory controller, the memory command from the rank that includes the memory die that is not functional to the other rank of the multiple ranks to enable access to the memory device.

41. The method of claim 40, further comprising determining that one or more other memory dies of the other ranks of the multiple ranks of the memory device are functional to store data.

42. The method of claim 40, wherein the determining, the correlating, or the storing is performed during fabrication, production, or testing of the memory device.

43. The method of claim 40, wherein the determining, the correlating, or the storing is performed following a power-up or reset of the memory device.

44. The method of claim 40, wherein an ordering or sequence of the rank selections does not correspond linearly with an ordering or sequence of the other ranks of the multiple ranks of the memory device that are functional to store data.

45. The method of claim 40, wherein the memory device comprises a number of physical ranks that include the rank and other ranks that is greater than a number of the rank selections accessible through memory addressing of the memory device.

46. The method of claim 40, wherein the corresponding is performed such that the rank that is not functional is excluded from the other ranks and is not accessible using the rank selections accessible through memory addressing of the memory device.

* * * * *